(12) United States Patent
Nikaeen et al.

(10) Patent No.: US 8,618,967 B2
(45) Date of Patent: Dec. 31, 2013

(54) SYSTEMS, CIRCUITS, AND METHODS FOR A SIGMA-DELTA BASED TIME TO DIGITAL CONVERTER

(75) Inventors: Parastoo Nikaeen, Mountain View, CA (US); Stefanos Sidiropoulos, Palo Alto, CA (US); Marc Joseph Loinaz, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/435,449

(22) Filed: Mar. 30, 2012

(65) Prior Publication Data

US 2013/0257494 A1 Oct. 3, 2013

(51) Int. Cl.
*H03M 3/00* (2006.01)

(52) U.S. Cl.
USPC .......... 341/143; 341/155; 331/16; 331/25; 327/156; 327/157; 327/158; 327/141; 455/76; 455/260; 375/371; 375/376

(58) Field of Classification Search
USPC .......... 341/111–155; 331/16, 25; 327/156, 327/157, 158, 141; 455/260, 76; 375/371, 375/376
See application file for complete search history.

(56) References Cited

U.S. PATENT DOCUMENTS

| | | | | |
|---|---|---|---|---|
| 5,563,535 | A * | 10/1996 | Corry et al. | 327/105 |
| 6,707,408 | B2 * | 3/2004 | Guedon et al. | 341/143 |
| 6,960,947 | B2 * | 11/2005 | Albasini et al. | 327/147 |
| 7,298,218 | B2 * | 11/2007 | Ghazali et al. | 331/16 |
| 7,570,182 | B2 * | 8/2009 | Sheba et al. | 341/118 |
| 7,809,338 | B2 * | 10/2010 | Tsfati | 455/76 |
| 7,894,564 | B2 * | 2/2011 | Hsiao-Chyi | 375/375 |
| 8,111,180 | B2 * | 2/2012 | Wiesbauer et al. | 341/143 |
| 8,330,510 | B2 * | 12/2012 | Lamanna et al. | 327/156 |

* cited by examiner

*Primary Examiner* — Lam T Mai
(74) *Attorney, Agent, or Firm* — Sterne, Kessler, Goldstein & Fox P.L.L.C.

(57) ABSTRACT

Systems, methods, and circuits provide a time to digital converter comprising a sigma-delta modulator. The sigma-delta based time to digital converter may receive an analog signal representing a phase error between a reference clock signal and a feedback clock signal and generate a digital signal representing the phase error. The sigma-delta modulator may comprise a subtractor, an integrator, a feedback path, and a quantizer. The subtractor may receive the analog signal and subtract a feedback signal from the analog signal and the integrator may integrate the output of the subtractor. The sigma-delta modulator may accumulate a voltage or a charge over a capacitor as pulses are received from the analog signal and after a number of clock cycles, the capacitor may be discharged to generate a pulse in an output signal.

20 Claims, 22 Drawing Sheets

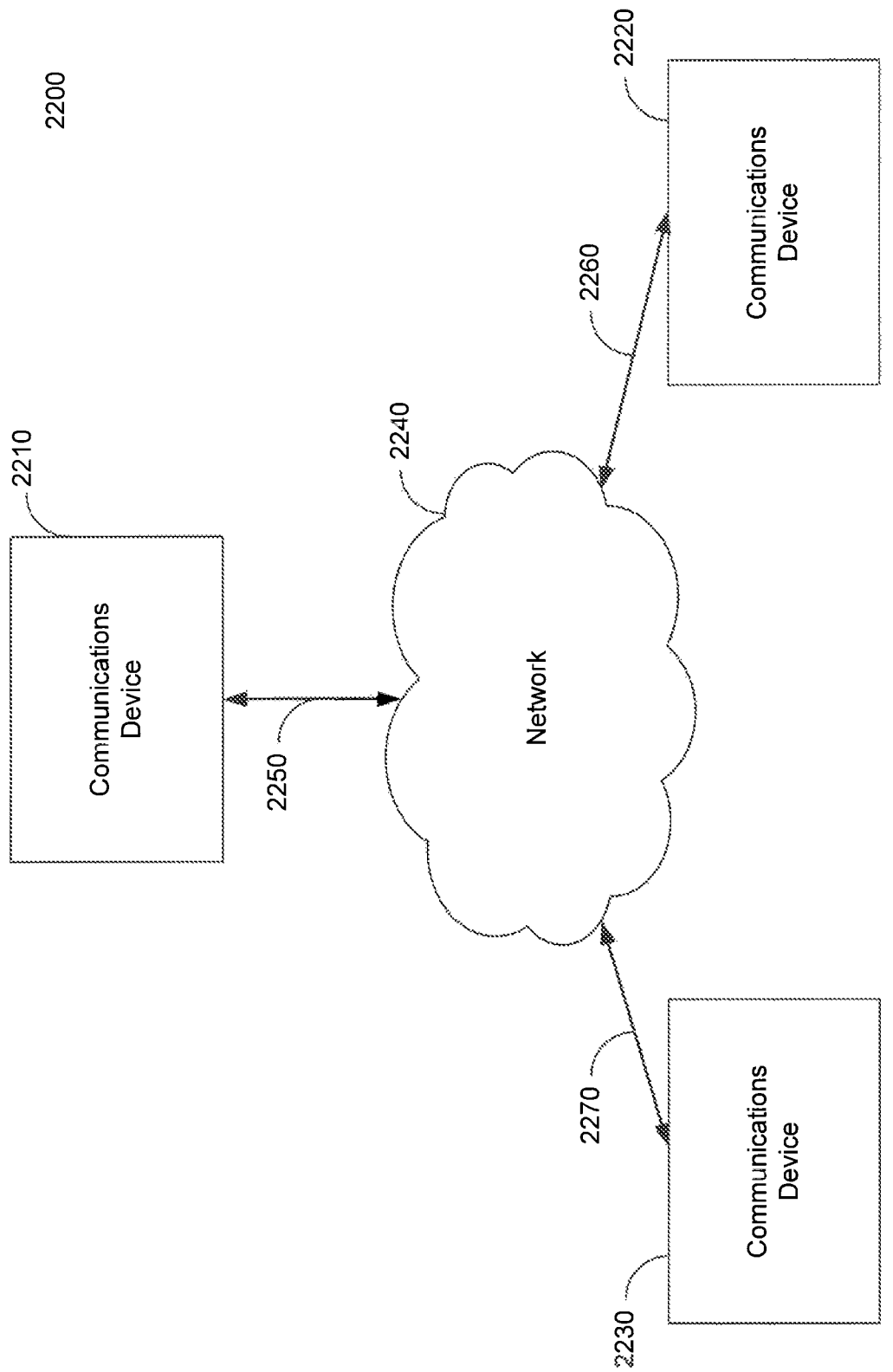

SYSTEMS, CIRCUITS, AND METHODS FOR A SIGMA-DELTA BASED TIME TO DIGITAL CONVERTER

BACKGROUND

1. Field of Disclosure

The present disclosure is related to the field of time to digital converters. For example, the present disclosure relates to systems, circuits, and methods for a sigma-delta based time to digital converter.

2. Related Art

Phase-locked loops (PLLs) may be used to generate an output signal based on an input reference signal. A conventional PLL comprises a phase detector to compare the phase of an input signal with the phase of a feedback signal of the output of an oscillator and adjusts the frequency of the oscillator until the phases of the reference signal and feedback signal match. PLLs may be implemented in the digital domain. However, conventional digital PLLs are typically associated with design limitations such as low accuracy, large area, and high power consumption.

Accordingly, it is highly desirable to develop systems, circuits and methods for a digital PLL. For example, it is highly desirable to implement components of a PLL that may provide a high accuracy for time-to-digital conversion.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

FIG. 22 is a block diagram illustrating one embodiment of a network system that incorporates the disclosed systems, circuits, and methods.

Figure 1:
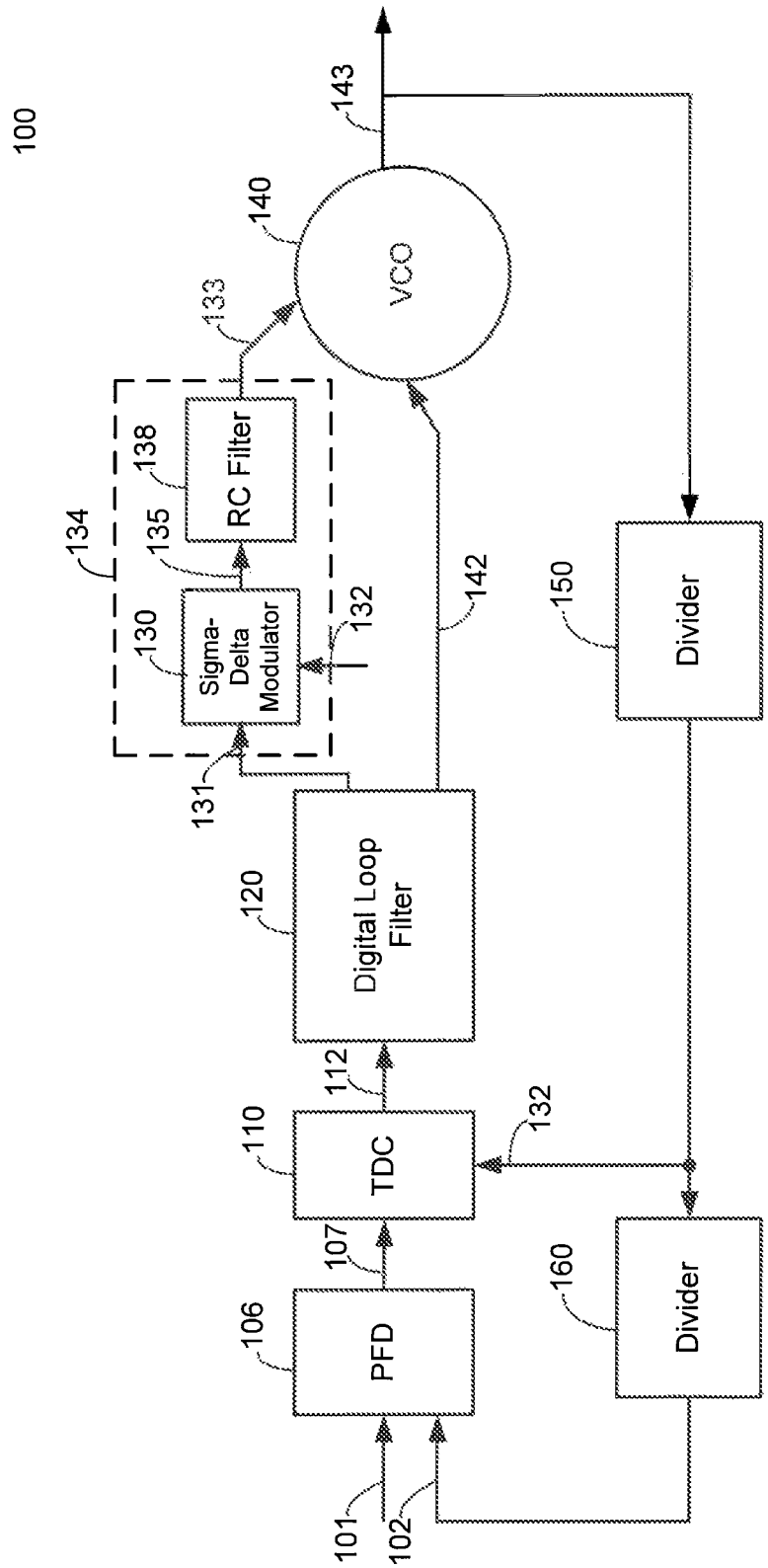
FIG. 1 illustrates a sigma-delta based phase-locked loop in accordance with some embodiments.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the disclosure. Rather, the scope of the disclosure is defined only in accordance with the following claims and their equivalents.

Those skilled in the relevant art(s) would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those skilled in the relevant art(s) would further appreciate that the various illustrative logical blocks, modules, circuits, and algorithm steps described in connection with the embodiments disclosed herein implemented in hardware, firmware, software, or any combination thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments.

The various illustrative logical blocks, modules, and circuits described in connection with the embodiments disclosed herein may be implemented or performed as instructions stored on a machine-readable medium, which may be read and executed by with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A machine-readable medium may include read only memory (ROM); random access memory (RAM); magnetic disk storage media; Optical storage media; flash memory devices; electrical, optical, acoustical or other forms of propagated signals (e.g., carrier waves, infrared signals, digital signals, etc.), and others.

The steps of a method or algorithm described in connection with the embodiments disclosed herein may be embodied directly in hardware, in a software module executed by a processor, or in a combination of the two. A software module may reside in the machine-readable medium as described above or any other form of storage medium known in the relevant art(s). An exemplary nonvolatile storage medium is coupled to the processor such the processor can read information from, and write information to, the storage medium. In the alternative, the nonvolatile storage medium may be integral to the processor. The processor and the nonvolatile storage medium may reside in an ASIC.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

FIG. 1 illustrates sigma-delta based phase-locked loop architecture 100 in accordance with some embodiments. In general, the sigma-delta based phase-locked loop (PLL) architecture 100 may receive a reference clock signal and generate an output clock signal. The sigma-delta based architecture 100 may use a sigma-delta based time to digital converter (TDC) to convert phase information to the digital domain and a sigma-delta based digital to analog converter (DAC) in combination with a voltage controlled oscillator (VCO) to generate the output clock signal. In some embodiments, the sigma-delta based PLL architecture 100 uses oversampling and noise-shaping, as described in further detail below, to minimize the quantization noise in a frequency band of interest. As such, the sigma-delta based PLL may achieve low jitter characteristics and high resolution for time-to-digital conversion.

As seen in FIG. 1, the sigma-delta based PLL architecture 100 may comprise a phase frequency detector (PFD) 106. In some embodiments, the PFD 106 receives a reference clock signal 101 and a feedback clock signal 102 (e.g., a signal from a feedback path). The reference clock signal 101 may be received from an external source and the feedback clock signal 102 may be generated and received from a VCO output as described in further detail below. The PFD 106 may be configured to detect a phase difference between two signals. For example, the PFD 106 may compare the phase of the reference clock signal 101 and the phase of the feedback clock signal 102 and generate a phase error signal 107. In some embodiments, the phase error signal 107 indicates a difference between the phase of the reference clock signal 101 and the phase of the feedback clock signal 102. The phase error signal 107 may comprise information for determining whether the VCO needs to operate at a higher frequency or a lower frequency. For example, the phase error signal 107 may comprise an 'up' sub-signal and a 'down' sub-signal, which are provided to a TDC 110. As such, the phase error signal 107 may be used to control the operation of the VCO. In some embodiments, the phase error signal 107 is an analog signal.

The sigma-delta based PLL architecture 100 may comprise a sigma-delta based TDC 110. As seen in FIG. 1, the sigma-delta based TDC may receive the phase error signal 107 and an oversampling clock signal 132 and generate a digital word 112 that digitally represents the amount of phase error indicated by the received phase error signal 107. A digital loop filter 120 may receive the digital word 112 and generate a DAC control signal 131 and a VCO tuning capacitor control signal 142. A digital sigma-delta DAC 134 may receive the DAC control signal 131 and the oversampling clock signal 132 and convert the DAC control signal 131 from the digital domain to an analog signal. For example, the digital sigma-delta DAC 134 may include a digital sigma-delta modulator 130 to convert the DAC control signal 131 to a VCO varactor control signal 135 and an RC low pass filter 138 to receive and filter the VCO varactor control signal 135 to provide the VCO varactor control signal 133. A VCO 140 may receive the analog VCO varactor control signal 133 and the digital VCO tuning capacitor control signal 142 and generate an output clock signal 143. In some embodiments, a divider 150 receives the output clock signal 143 and divides the output clock signal 143 to generate the oversampling clock signal 132. A divider 160 may receive the oversampling clock signal 132 and divide the oversampling clock signal 132 to generate the feedback clock signal 102.

Figure 2:
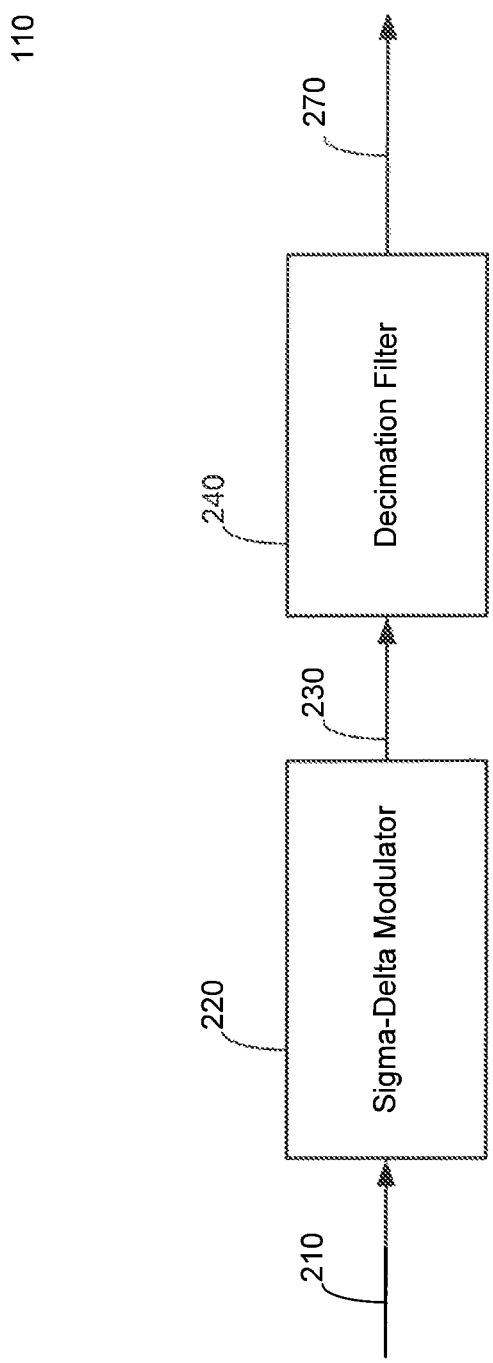
FIG. 2 is a block diagram of an example time to digital converter in accordance with some embodiments.

FIG. 2 is a block diagram of an example TDC 110 in accordance with some embodiments. In general, the TDC 110 may receive a phase error signal and convert the phase error signal to the digital domain and/or to a digital signal. In some embodiments, the TDC 110 may generate a value in the digital domain based on the widths of one or more pulses corresponding to the phase error.

As seen in FIG. 2, the TDC 110 may comprise a sigma-delta modulator 220 that receives a phase error signal 210 (e.g., phase error signal 107) and generates a digital bitstream 230 representing the phase error. As such, the TDC 110 may be considered a sigma-delta based TDC. A decimation filter 240 may receive the digital bitstream 230 and generate a TDC output signal 270 (e.g., signal 112).

In operation, the sigma-delta modulator 220 of the TDC 110 may receive the phase error signal 210 from a phase frequency detector (e.g., PFD 106) and output a digital bitstream 230. As such, in some embodiments, the sigma-delta modulator 220 samples the phase error at the output of a phase frequency detector. In some embodiments, the sigma-delta modulator 220 shapes the quantization noise so as to concentrate the noise power at higher frequencies. The decimation filter 240 receives the digital bitstream 230, filters out high-frequency quantization noise, and down-samples the digital bitstream 230 to generate the TDC output signal 270. As such, the TDC output signal 270 may digitally represent the amount of phase error between a reference clock signal and a feedback clock signal. Further details with regard to the sigma-delta modulator 220 and the decimation filter 240 are discussed below with relation to FIGS. 3-7.

Figure 3:
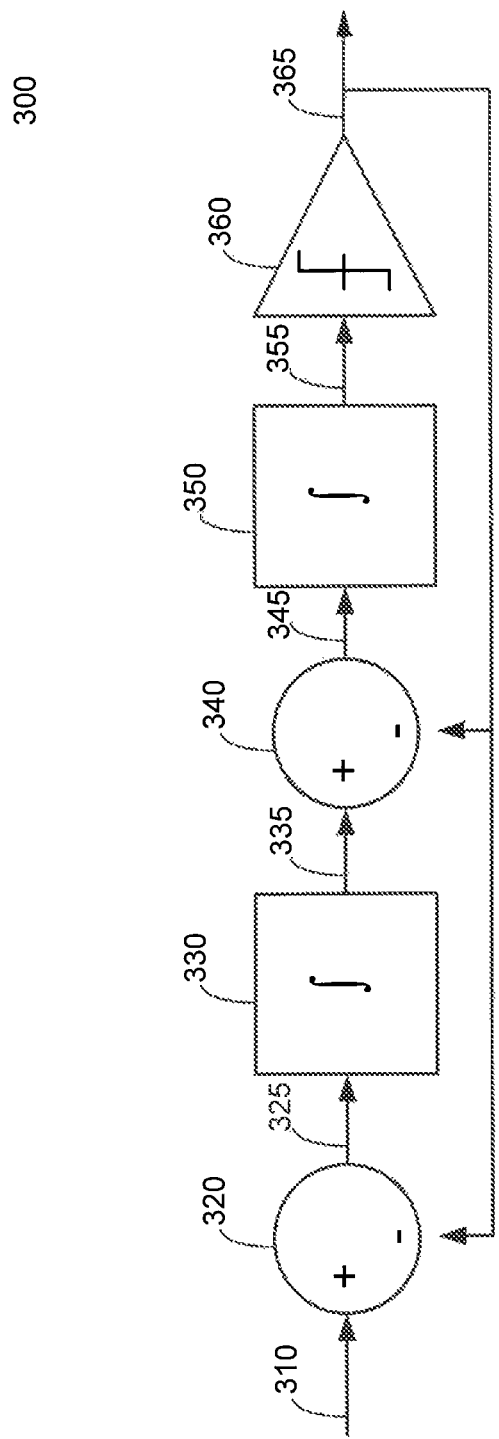
FIG. 3 illustrates an example block diagram of a second order sigma-delta modulator in accordance with some embodiments.

FIG. 3 illustrates an example block diagram of a second order sigma-delta modulator 300 (e.g., sigma-delta modulator 220) in accordance with some embodiments. In general, the second order sigma-delta modulator 300 receives an input signal 310 (e.g., input signal 210) and generates an output signal 365 (e.g., output signal 230). The second order sigma-delta modulator 300 may receive and detect pulses on the input signal 310 and generate an output pulse on the output signal 365 after an accumulation of pulses received from the input signal 310. Although FIG. 3 refers to a second order sigma-delta modulator, different types of sigma-delta modulators may be used for the systems, circuits, and methods disclosed herein. For example, a first order sigma-delta modulator may be used instead of a second order sigma-delta modulator. As such, a sigma-delta modulator of any order may be used in the disclosed systems, circuits, and methods.

As seen in FIG. 3, the second order sigma-delta modulator 300 may comprise subtractors 320 and 340, integrators 330 and 350, and a quantizer 360. The subtractor 320 may receive the input signal 310 and may receive the output signal 365 from a feedback path. In some embodiments, the subtractor 320 subtracts the output signal 365 from the input signal 310 to generate a first subtractor output signal 325. An integrator 330 may receive the first subtractor output signal 325 and integrate the received first subtractor output signal 325 to generate an integrated first subtractor output signal 335. A subtractor 340 may receive the integrated first subtractor output signal 335 and receive the output signal 365 from the feedback path. In some embodiments, the subtractor 340 subtracts the output signal 365 from the integrated first subtractor output signal 335 to generate a second subtractor output signal 345. An integrator 350 may receive the second subtractor output signal 345 and integrate the received second subtractor output signal 345 to generate an integrated second subtractor output signal 355.

In some embodiments, a quantizer 360 receives the integrated second subtractor output signal 355 and generates the output signal 365. In some embodiments, the quantizer 360 is a single-bit quantizer. In the same or alternative embodiments, the quantizer 360 is a single-bit comparator. The quantizer 360 may comprise a strong-arm latch operating at a frequency of an oversampling clock (e.g., oversampling clock 132). Thus, the quantizer 360 may be used to sample the integrated second subtractor output signal 355 based on the received oversampling clock. The output signal 365 of the quantizer 360 may be received by a static latch coupled to a flip-flop to generate an output digital bitstream.

Figure 4:
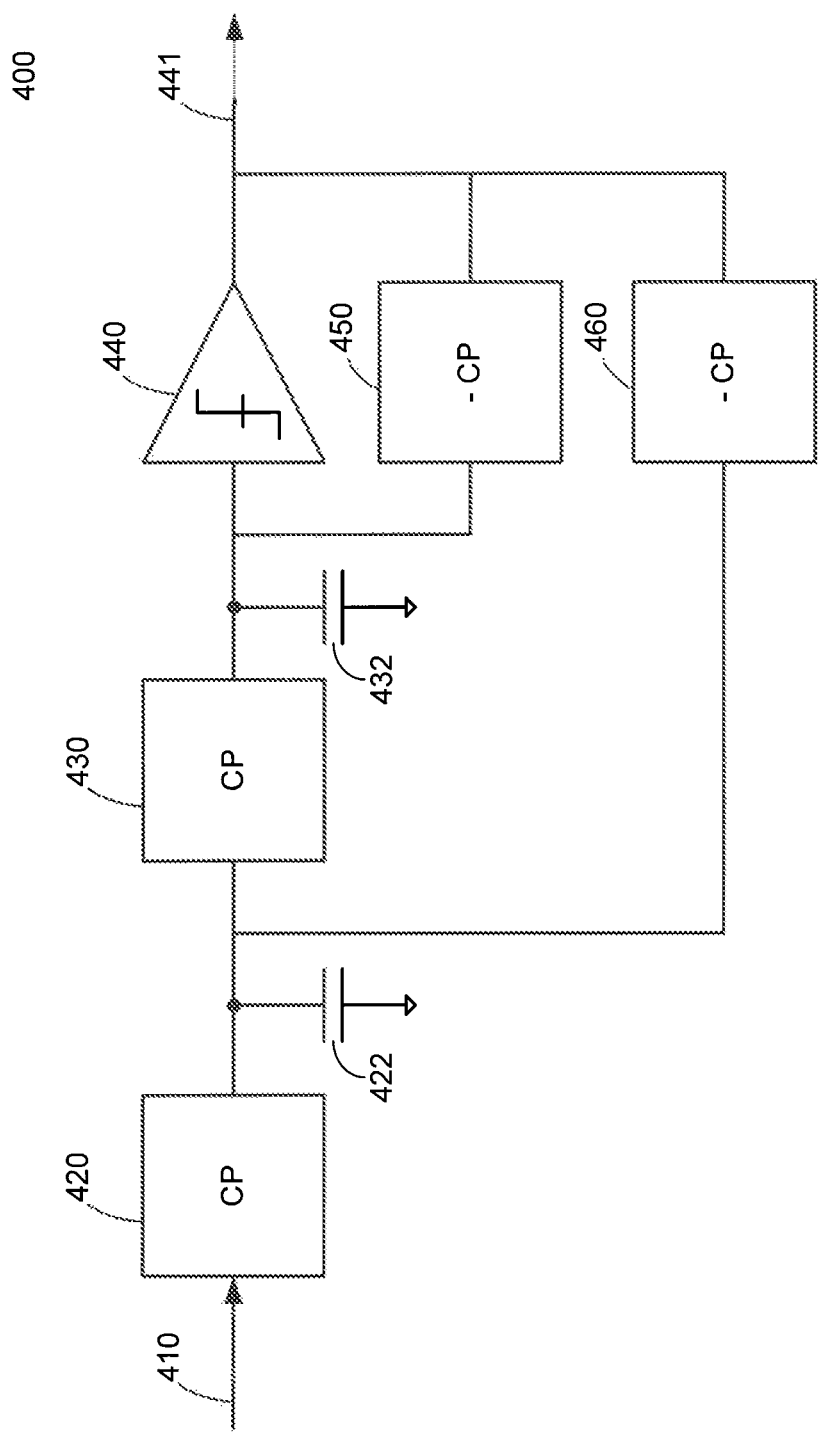
FIG. 4 is a block diagram of an example second order sigma-delta modulator implemented with charge pumps and capacitors that can be used for time to digital conversion.

FIG. 4 is a block diagram of an example second order sigma-delta modulator 400 implemented with charge pumps and capacitors to be used for converting time domain pulses to a digital bitstream.

As seen in FIG. 4, the second order sigma-delta modulator 400 (e.g., sigma-delta modulator 220 and/or 300) may be implemented with charge pumps 420, 430, 450, and 460, capacitors 422 and 432, and quantizer 440. The charge pump 420 may receive an input signal 410 (e.g., a phase error signal 310 and/or 210) and the quantizer 440 may generate an output signal 441 (e.g., a digital bitstream signal 365 and/or 230). A capacitor 422 and the output of a charge pump 460 may be coupled to the output of the charge pump 420 and the output of the charge pump 420 may be received by the charge pump 430. A capacitor 432 and the output of a charge pump 450 may be coupled to the output of the charge pump 430 and a quantizer 440 may receive the output and generate the output signal 441. In some embodiments, a capacitor (e.g., capacitor 422 and/or 432) and a charge pump (e.g., charge pump 460 and/or 430) may be the equivalent of an integrator (e.g., integrator 330 and/or 360). In the same or alternative embodiments, the charge pumps 450 and 460 comprise opposite connections (e.g., the outputs are connected in reverse) when compared to the charge pumps 420 and 430. In some embodiments, the output of the charge pumps 420 and 430 may be the equivalent of the output of a subtractor (e.g., subtractors 320 and/or 340).

Figure 5:
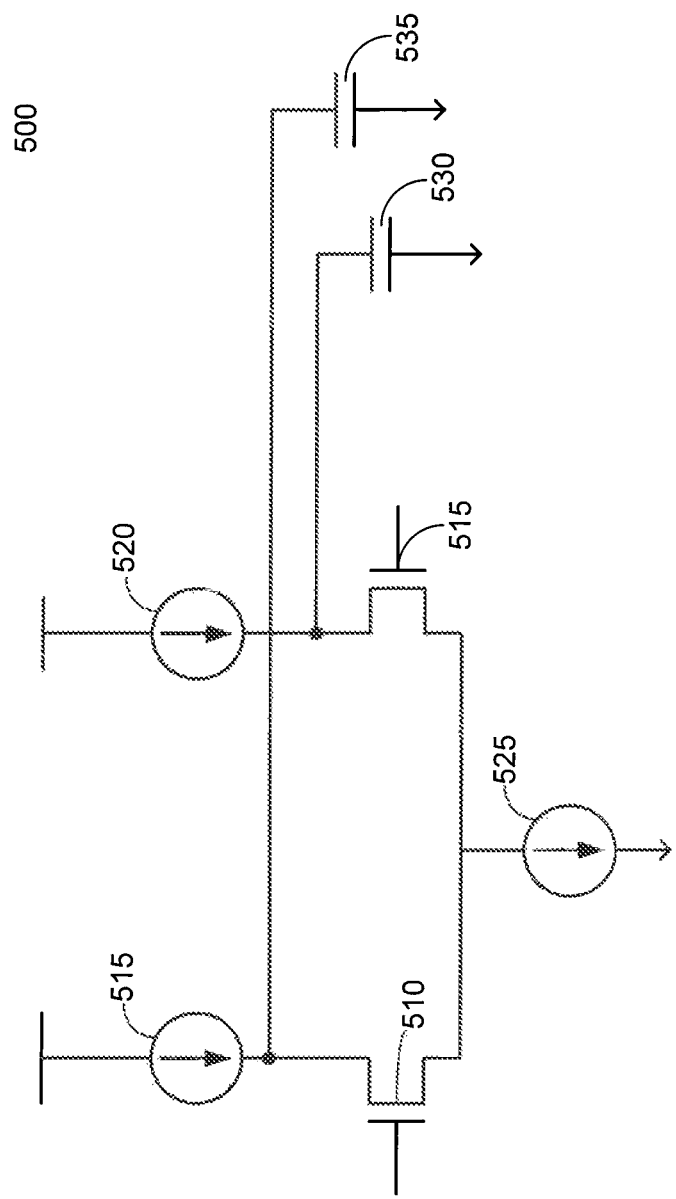
FIG. 5 illustrates a schematic architecture of a differential charge pump in accordance with some embodiments.

FIG. 5 illustrates a schematic architecture of a differential charge pump 500 (e.g., charge pumps 420, 430, 450, and/or 460). In general, the differential charge pump 500 comprises current source loads to generate a current to charge or discharge capacitors.

As seen in FIG. 5, the differential charge pump 500 comprises current sources 515, 520, and 525, and transistors 510 and 515. The transistors 510 and 515 may comprise an n-type metal-oxide-semiconductor (nMOS) field effect transistor. In some embodiments, the transistors 505 and 515 may receive a phase error signal from a phase frequency detector. The phase error signal from the phase frequency detector may be converted to a Current Mode Logic (CML) signal. As such, the transistor 510 may receive a first complementary signal of the phase error signal from the phase frequency detector and the transistor 515 may receive a second complementary signal of the phase error signal from the phase frequency detector. In some embodiments, the phase error signal from the phase frequency detector is converted to CML signals or waveforms to keep a tail current source in saturation during transitions and to avoid coupling on the outputs of the differential charge pump 500.

The current source 515 may be coupled to a contact of the transistor 510 and the current source 520 may be coupled to a contact of the transistor 515. Each of the transistors 510 and 515 may be coupled to the current source 525 at a second contact of each transistor. The output of the current source 525 may be coupled to ground. In some embodiments, the current source 515 generates a current to charge a capacitor 535 and the current source 520 generates a current to charge a capacitor 530.

In operation, the differential charge pump 500 may charge or discharge the capacitors 530 and 535. As previously discussed, the phase error signal output of a phase frequency detector may be converted to a differential signal (CML) and each of the transistors 510 and 515 may receive a complementary signal of the differential signal. As such, the transistor 510 may receive a first complementary signal that may allow a current to go through a channel of the transistor 505 to the current source 525. In such an event, the capacitor 535 may be discharged through the transistor 510. At the same time, while the capacitor 535 may be discharged, the transistor 515 may receive the second complementary signal and may not allow current to go through a channel of the transistor 515 to the current source 525. In such an event, the current from the current source 520 will charge the capacitor 530. Similarly, on a transition of the phase error signal output of the phase frequency detector, the transistor 510 may receive the first complementary signal and not allow current to go through a channel of the transistor 510. As such, the capacitor 535 may be charged from the current from the current source 515. At the same time, while the capacitor 535 is being charged, the capacitor 530 may be discharged through the transistor 515. In some embodiments, the discharge from the capacitor 530 and/or the capacitor 535 may result in a differential output signal.

As such, each of the capacitors 530 and 535 may be charged or discharged. In some embodiments, the stored voltage on the capacitors 530 and 535 may be charged and discharged with a slope of I/C where I is the current from the current source 515 and/or 520 and C is the capacitance of the capacitor 530 and/or 535. In some embodiments, the values of I and C may be defined to not get small enough to be affected by random noise or to be large enough to make the transistors of the next stage to go out of saturation.

Figure 6:
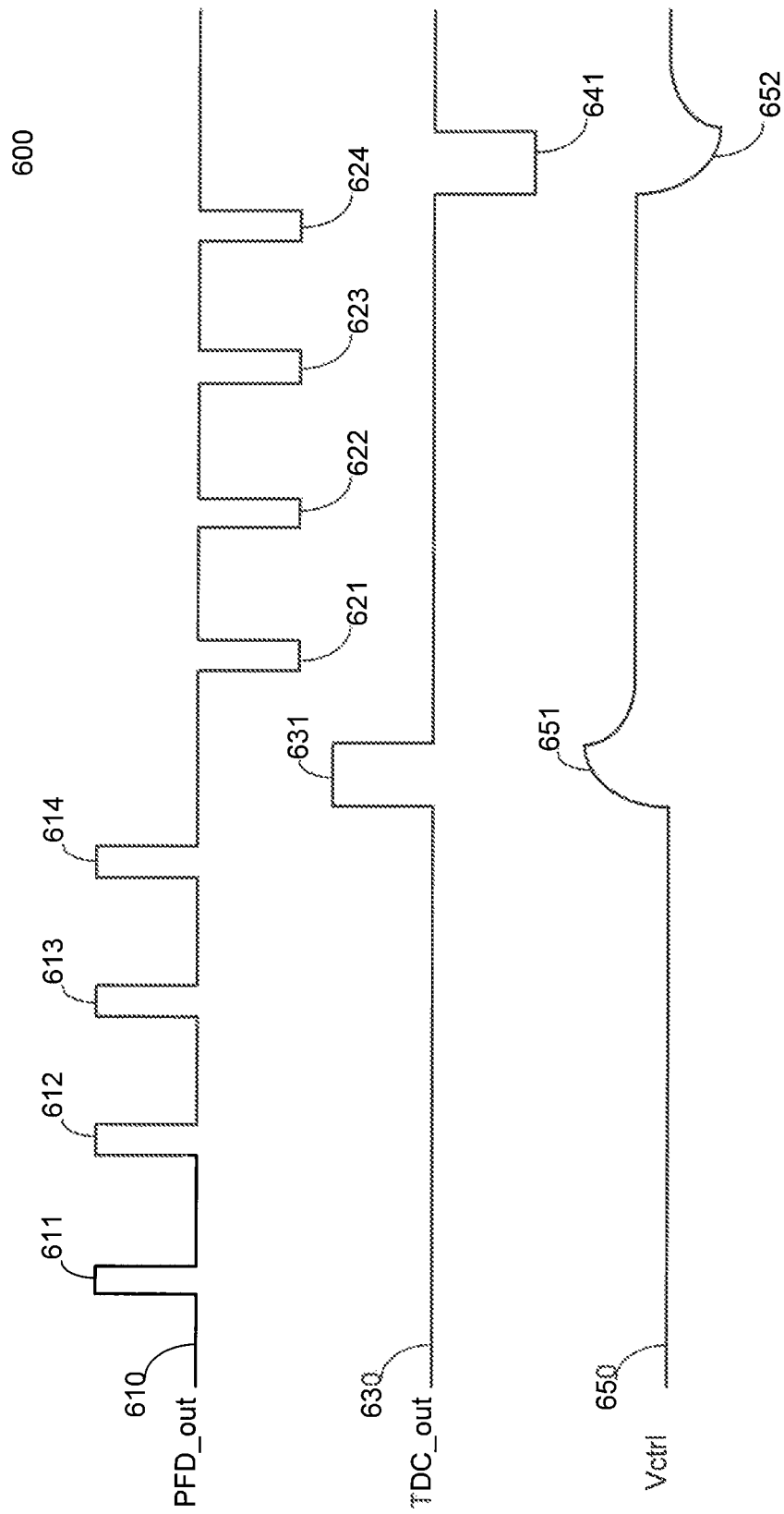
FIG. 6 illustrates a timing diagram of an example output of an example sigma-delta based time to digital converter used in a PLL loop while it is locked.

FIG. 6 illustrates a timing diagram 600 of an example output of a sigma-delta based time to digital converter (e.g., TDC 110) used in some embodiments. In general, the sigma-delta based TDC accumulates pulses and outputs a pulse in response. The output of the TCD may have a pulse structure as illustrated in FIG. 6, when it is in a locked PLL loop and its input phase errors are close to zero.

As seen in FIG. 6, the timing diagram 600 comprises a PFD output signal 610, TDC output signal 630, and a VCO control voltage signal 650. The PFD output signal 610 may be generated by a phase frequency detector (e.g., PFD 106). In some embodiments, the PFD output signal 610 comprises one or more pulses. Each pulse of the PFD output signal 610 may represent a phase error between a reference clock signal and a feedback clock signal as received by the PFD. In some embodiments, a pulse may be received at each clock cycle. In some embodiments, the pulses of the PFD output signal 610 may comprise a '+1' (e.g., an UP pulse) or a '−1' (e.g., a DOWN pulse) pulse. Each of the pulses of the PFD output signal 610 may accumulate a voltage or a charge. For example, the PFD output signal 610 may comprise '+1' pulses 611, 612, 613, and 614. In some embodiments, each of the pulses 611, 612, 613, and 614 may accumulate a voltage over or a charge on a capacitor (e.g., capacitor 530 and/or 535) of a sigma-delta modulator of a TDC. At the accumulation of a certain voltage or charge at the capacitor after a number of cycles, the TDC may output a pulse on the TDC output signal 630. For example, after accumulating voltages from '+1' pulses 611, 612, 613, and 614 from the PFD output signal 610, the TDC may generate a '+1' output pulse 631 at the TDC output signal 630. The TDC may receive and accumulate additional pulses from the PFD output signal 610 and generate an additional pulse at the TDC output signal 630. For example, the TDC may receive '−1' pulses 621, 622, 623, and 624 from the PFD output signal 610. In some embodiments, each of the pulses 621, 622, 623, and 624 accumulates a voltage and/or charge on a capacitor (e.g., capacitor 630 and/or 635) of a sigma-delta modulator of the TDC. At the accumulation of a certain voltage and/or charge or after a certain number of pulses have been received (e.g., after a certain number of cycles) at the capacitor, the TDC may output a '−1' pulse 641 on the TDC output signal 630. In some embodiments, the value generated by the TDC (e.g., the output pulse 631 and/or output pulse 641) may be based on the widths of the pulses (e.g., the pulses 611, 612, 613, and 614 and/or pulses 621, 622, 623, and 624) corresponding to the phase error.

As such, the TDC may accumulate one or more pulses from a phase error signal. After the accumulation (e.g., after an accumulation of voltage stored on the capacitors), the TDC may output a pulse signal. In some embodiments, the TDC output pulse signal may correspond to the type (e.g., '+1' or '−1') of pulses that have accumulated.

As seen in FIG. 6, a pulse on the TDC output signal 630 may affect a VCO control signal 650. In some embodiments, a pulse on the TDC output signal 630 may generate a ripple on the voltage of the VCO control signal 650. For example, the pulse 631 of the TDC output signal 630 may generate a ripple 651 on the VCO control signal 650. Similarly, the pulse 641 of the TDC output signal 630 may generate a ripple 652 on the VCO control signal 650. The VCO control signal 650 may control a VCO and, as such, the ripples 651 and 652 may affect the VCO to adjust the frequency of the output clock of the VCO such that the phase error is canceled. Details with regard to the VCO are described in further detail below with relation to FIGS. 13 and 14.

As such, a TDC may comprise a sigma-delta modulator and a decimation filter. In some embodiments, the sigma-delta modulator comprises at least one integrator, at least one subtractor, a quantizer, and a feedback path. The subtractor may subtract a signal from the feedback path from an output signal of the integrator. The sigma-delta modulator may be used to detect and accumulate pulses from an output of a phase frequency detector. In some embodiments, after a plurality of cycles of receiving the pulses from the output of the phase frequency detector, the TDC may generate an output pulse. Thus, the sigma-delta based TDC may be used to detect narrow width or small pulses from a phase detector, accumulate the narrow width or small pulses from the phase detector, and generate an output pulse after receiving a plurality of the narrow width or small pulses from the phase detector. Since the sigma-delta based TDC may detect narrow width or small pulses, a TDC comprising the sigma-delta modulator may achieve a high resolution.

Figure 7:
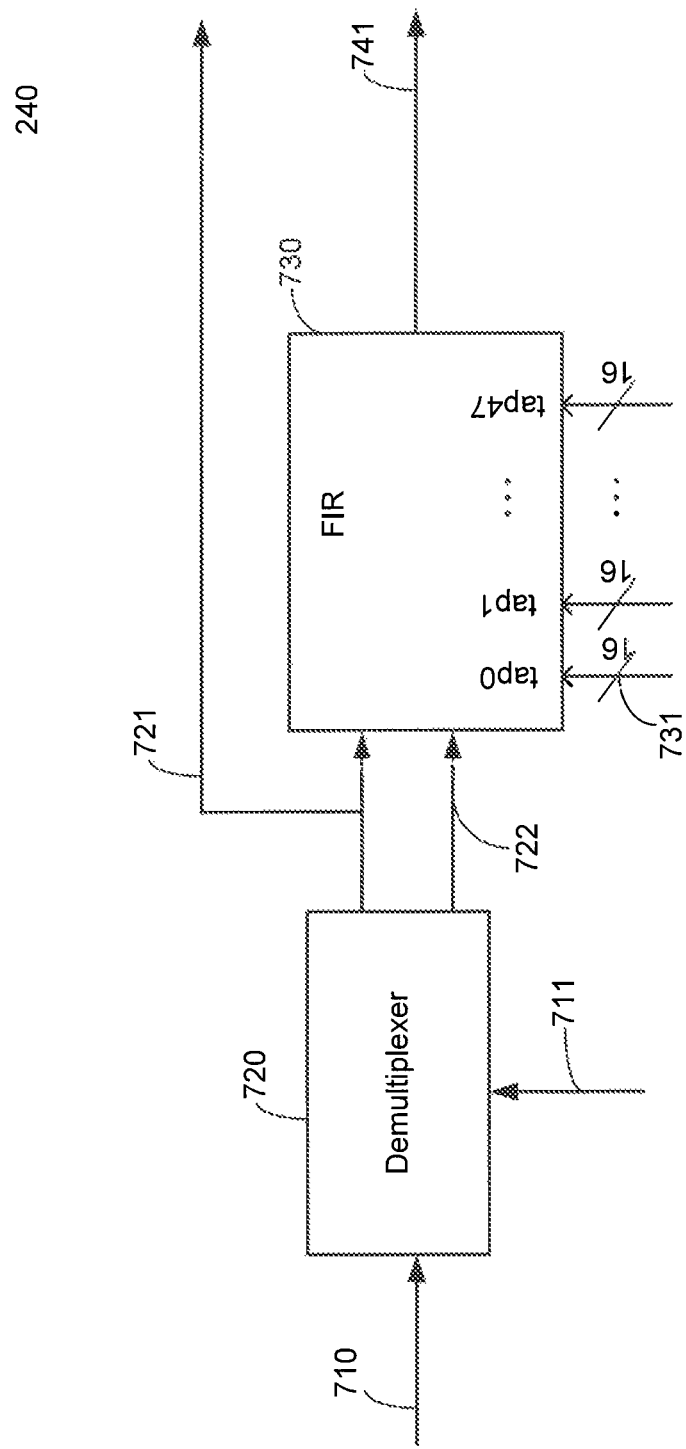
FIG. 7 is a block diagram of a decimation filter used in accordance with some embodiments.

FIG. 7 is a block diagram of an example decimation filter 240 used in the TDC in accordance with some embodiments. In general, the decimation filter 240 may receive the output of a sigma-delta modulator and filter and down-sample the output of the sigma-delta modulator.

As seen in FIG. 7, the decimation filter 240 may comprise a demultiplexer 720 and a finite impulse response (FIR) filter 730. The demultiplexer 720 may receive a sigma-delta modulator output signal 710 (e.g., signal 365 and/or 441) and an oversampling clock signal 711. In some embodiments, the demultiplexer 720 receives the sigma-delta modulator output signal 710 and outputs a plurality of 8-bit outputs. For example, the demultiplexer 720 may comprise a 1-to-8 demultiplexer. As such, the demultiplexer 720 may receive 1-bit data and output an 8-bit signal. The demultiplexer 720 may further generate a downsampling clock signal 721.

In some embodiments, the FIR filter 730 receives the downsampling clock signal 721 and the demultiplexer output 722 and generates a FIR filter output signal 741 (e.g., TDC output signal 112 and/or 270). In some embodiments, the FIR filter output signal 741 may comprise a 19-bit output. The FIR filter 730 may comprise 48 taps. In some embodiments, the 48 taps of the FIR filter 730 may be defined by the following tap values (normalized to one), where tap 25 through tap 47 are equal to tap 23 through tap 1 (e.g., the FIR filter taps are symmetrical):

| | | |
|---|---|---|
| Tap 1: 0.000000030 | Tap 2: 0.000000253 | Tap 3: 0.000000253 |
| Tap 4: 0.000007190 | Tap 5: 0.000028402 | Tap 6: 0.000097021 |
| Tap 7: 0.000293344 | Tap 8: 0.000797991 | Tap 9: 0.001976937 |
| Tap 10: 0.004501745 | Tap 11: 0.009490877 | Tap 12: 0.018632777 |
| Tap 13: 0.034223527 | Tap 14: 0.059034899 | Tap 15: 0.095939785 |
| Tap 16: 0.147274463 | Tap 17: 0.214009583 | Tap 18: 0.294910818 |
| Tap 19: 0.385952890 | Tap 20: 0.480259493 | Tap 21: 0.568746388 |
| Tap 22: 0.641455263 | Tap 23: 0.689336717 | Tap 24: 0.706056170 |

Figure 8:
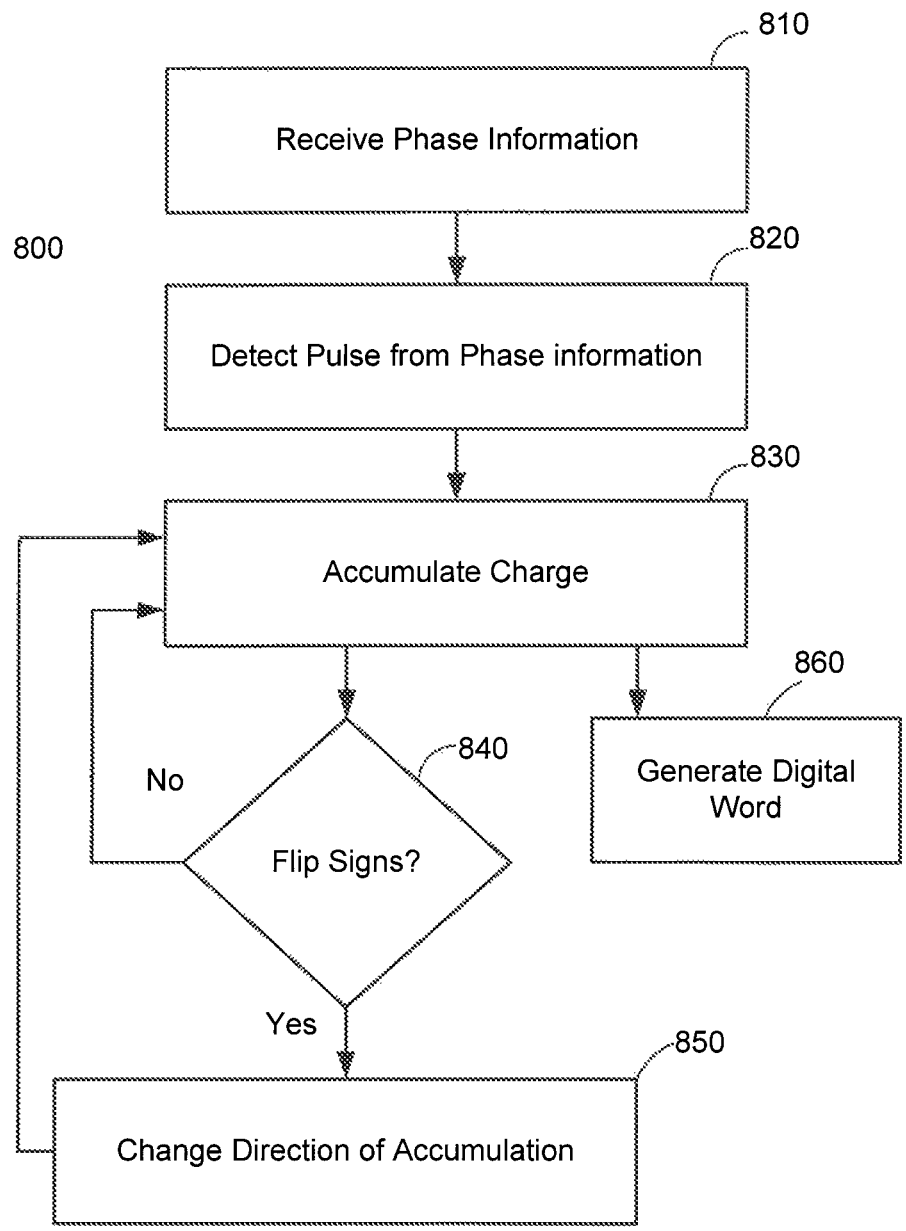
FIG. 8 is a flow diagram of an example method for receiving phase information and converting the phase information into a digital signal.

FIG. 8 is a flow diagram of an example method 800 for receiving phase information and converting the phase information into a digital signal. At block 810, phase information may be received. For example, the phase information may indicate a phase difference between a first signal (e.g., a reference clock signal 101) and a second signal (e.g., a feedback clock signal 102). In some embodiments, the phase information comprises a pulse to indicate a phase difference between the reference clock signal and the feedback clock signal. The phase information may be received by a TDC (e.g., TDC 110). At block 820, a pulse from the phase information may be detected. In some embodiments, the phase information is converted to a pulse in the PFD and/or a part of the TDC. For example, a sigma-delta modulator (e.g., sigma-delta modulator 220, 300 and/or 400) may detect a narrow width pulse of the phase information. At block 830, this pulse can cause charge to be accumulated. In some embodiments, the accumulation of the charge corresponds to an accumulation of a voltage over or a capacitor of a sigma-delta modulator. For example, each pulse of the phase information may add a voltage to a capacitor (e.g., capacitor 422, 432, 630, and/or 635) of the sigma-delta modulator (e.g., sigma-delta modulator 220, 300, and/or 400). At block 840, a determination is made whether an output of a quantizer (e.g., quantizer 360 and/or 440) flips signs. If the quantizer has flipped signs, the accumulation of the charge continues at block 830. However, if the input and/or output of the quantizer flip signs, then at block 850 a direction of the accumulation changes and, the accumulation proceeds once again at block 830. For example, each subsequent pulse of the phase information may subtract the charge to the capacitor of the sigma-delta modulator when the charge was added before the flipping of the signs. As another example, each subsequent pulse of the phase information may add the charge to the capacitor of the sigma-delta modulator when the charge was subtracted before the flipping of the signs.

At block 860, the output of the quantizer is averaged to generate a digital word representing the phase information. For example, a bitstream output signal (e.g., output signal 365 and/or 441) of the quantizer may be averaged out in a filter (e.g., decimation filter 240 and/or 700) and may result in a pulse at the output of the TDC.

Figure 9:
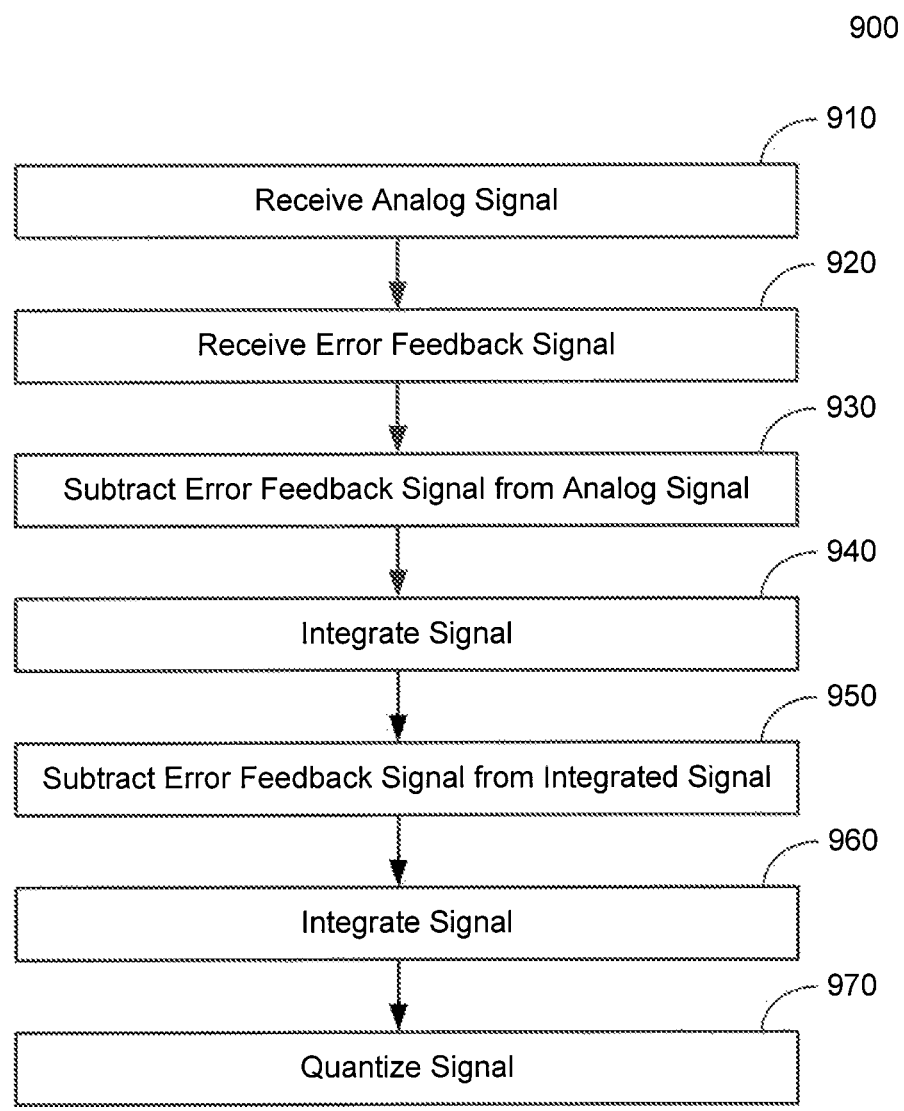
FIG. 9 is a flow diagram of an example method for quantizing phase information in accordance with some embodiments.

FIG. 9 is a flow diagram of an example method 900 for quantizing phase information in accordance with some embodiments of a sigma-delta modulator (e.g., sigma-delta modulator 220, 300, and/or 400). At block 910, an input signal (e.g., a phase-domain signal and/or a time-domain signal) may be received. In some embodiments, the input signal is a phase error signal that indicates a phase error between a reference clock signal and a feedback clock signal (e.g., an inverse of the reference clock signal). A subtractor (e.g., subtractor 320) may receive the signal. At block 920, an error feedback signal may be received. For example, the subtractor may receive the error feedback signal. At block 930, the error feedback signal may be subtracted from the input signal. In some embodiments, a subtractor (e.g., subtractor 320) receives the input signal and the error feedback signal and subtracts the error feedback signal from the analog signal to generate a subtracted signal. At block 940, the subtracted signal may be integrated. For example, an integrator (e.g., integrator 330) may integrate the subtracted signal that corresponds to a difference between the input signal and the error feedback signal and generate an integrated signal. At block 950, the error feedback signal may be subtracted from the integrated signal. For example, a second subtractor (e.g., subtractor 340) may receive the integrated output and the error feedback signal and subtract the error feedback signal from the integrated output to generate a second subtractor output. At block 960, the second subtractor output may be integrated. For example, a second integrator (e.g., integrator 350) may integrate the second subtractor output. At block 970, the output of the second integrator may be quantized. For example, a quantizer (e.g., quantizer 360 and/or 440) may receive the integrated signal from the second integrator and convert the integrated signal to a digital signal (e.g., a logical '1' or a logical '0'). As such, the input signal may be converted to a digital signal by using a feedback path.

Figure 10:
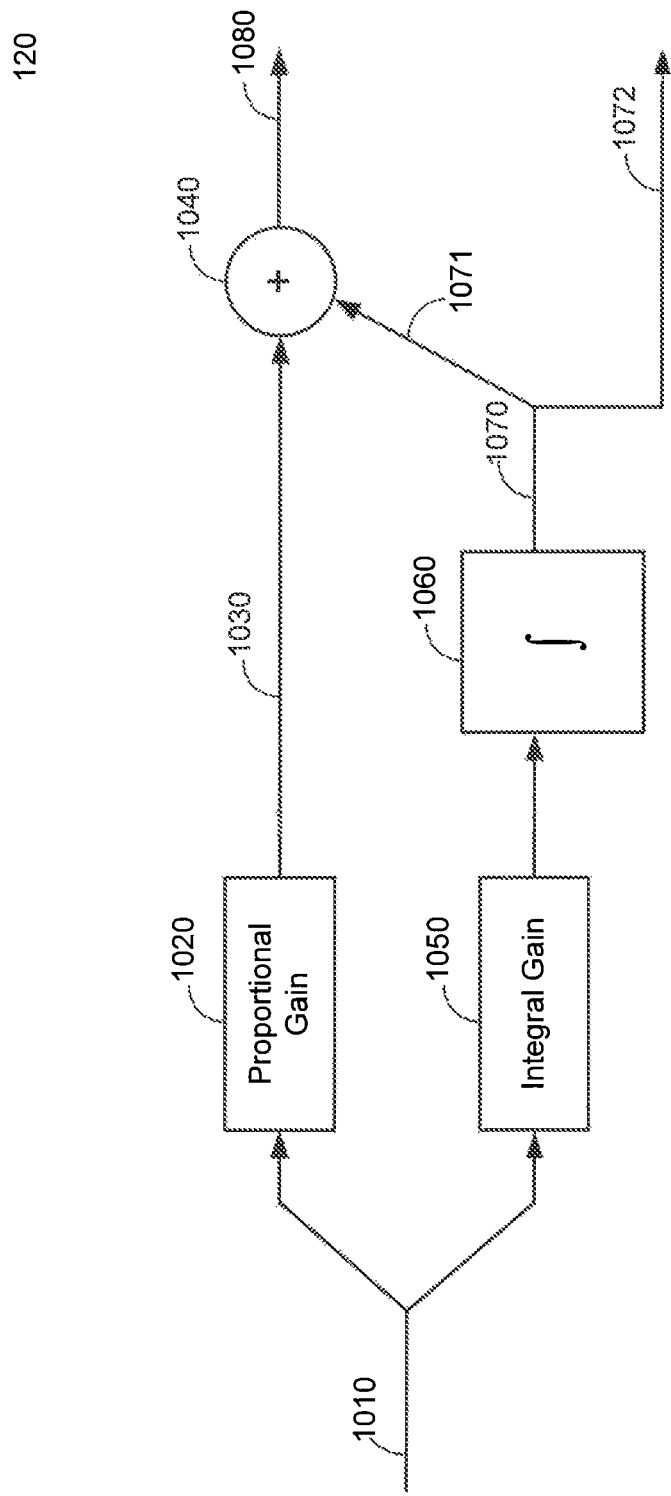
FIG. 10 is a block diagram of a digital loop filter in accordance with some embodiments.

FIG. 10 is a block diagram of a digital loop filter 120 in accordance with some embodiments. In general, the digital loop filter 120 may receive the output of a TDC and generate control signals for a VCO.

As seen in FIG. 10, the digital loop filter 120 may comprise gain factors 1020 and 1050. Each of the gain factors 1020 and 1050 may receive an input signal 1010 (e.g., digital word 112). In some embodiments, an input signal 1010 may comprise the output of a TDC. In some embodiments, a proportional path may comprise the gain factor 1020 to generate a proportional value signal 1030. In the same or alternative embodiments, an integral path may comprise the gain factor 1050 and an integrator 1060 to generate an integral value 1070. The values of the gain factor 1020 and the gain factor 1050 of the digital loop filter 120 may be calculated from the corresponding resistance and capacitance values of a corresponding analog filter based on the following equation:

$$IR + \frac{I}{CS} \Rightarrow IR + \frac{IT_{ref}}{C} \frac{z^{-1}}{1-z^{-1}}$$

In some embodiments, I is the current of the analog charge pump (proportional to the phase error), R is the resistance used in a corresponding analog filter, C is the capacitance used in the corresponding analog filter, S is the Laplace variable, $T_{ref}$ is the sampling period. In the same or alternative embodiments, the left hand side of the above equation may relate to the corresponding analog filter and the right hand side of the above equation may relate to the digital loop filter. In some embodiments, $z=e^{jwt}$ and/or $z\approx1+sT$, where Z is the Z-transform variable in a digital system, T is the sampling period and w is the sampling frequency in radian. In some embodiments, IR may correspond to the first gain factor 1020 (e.g., a proportional gain factor) and $$\frac{IT_{ref}}{C}$$

may correspond to the second gain factor 1050 (e.g., an integral gain factor).

A summer 1040 may receive the proportional value signal 1030 and a number of least significant bits (e.g., the eleven least significant bits (LSB)) 1071 of the integral value signal 1070. In some embodiments, a summer 1040 receives the proportional value signal 1030 and the eleven LSB 1071 of the integral value signal 1070 and adds the two received signals to generate a VCO varactor control signal 1080. A number of most significant bits (e.g., seven most significant bits (MSB)) of the integral value signal 1070 may be used to generate a VCO tuning capacitor control signal 1072.

As such, the digital loop filter 120 may receive a TDC output signal and generate a first control signal and a second control signal. The first control signal (e.g., a VCO varactor control signal 1080) may be used to control a sigma-delta DAC, as discussed in further detail below with relation to FIGS. 11-13. The second control signal (e.g., a VCO tuning capacitor control signal 1072) may be used to control a bank of fixed capacitors in a VCO, as discussed in further detail below with relation to FIGS. 11 and 13. In some embodiments, both the VCO varactor control signal 1080 and the VCO tuning capacitor 1072 control signal are digital signals.

Figure 11:
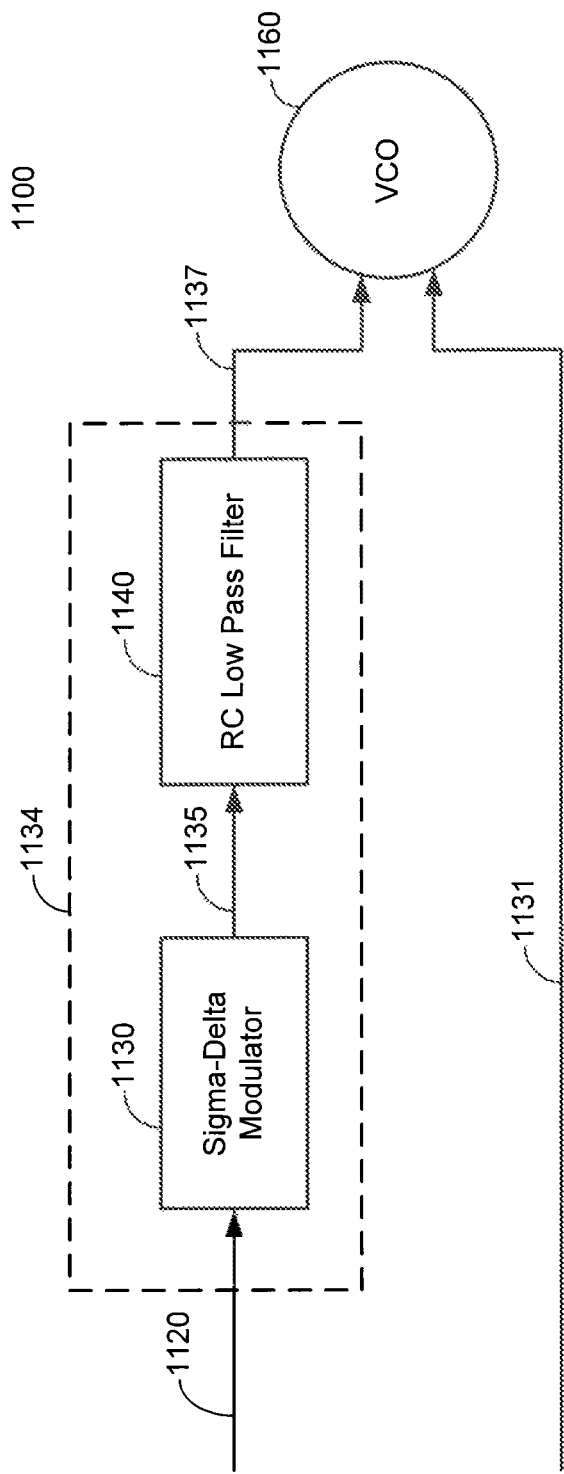
FIG. 11 illustrates a block diagram of a digitally controlled oscillator in accordance with some embodiments.

FIG. 11 illustrates a block diagram of a digitally controlled oscillator (DCO) 1100 in accordance with some embodiments. In general, the DCO 1100 may comprise a VCO 1160 (e.g., VCO 140 and/or 1300) that is at least partly controlled by a digital sigma-delta modulator 1130 (e.g., digital sigma-delta modulator 130 and/or 1210).

As seen in FIG. 11, the DCO 1100 may receive a first control input signal 1120 (e.g., VCO varactor control signal 1080) and a second control input signal 1131 (e.g., VCO tuning capacitor control signal 1072). In some embodiments, a digital loop filter (e.g., digital loop filter 120) may generate the first control input signal 1120 and the second control input signal 1131. For example, the first control input signal 1120 may be a VCO varactor control signal and the second control input signal 1131 may be a VCO tuning capacitor control signal. In some embodiments, both the first control input signal 1120 and the second control input signal 1131 are digital signals. A digital sigma-delta DAC 1134 may receive the first control input signal 1120 and convert the first control input signal 1120 from a digital signal to an analog signal such as analog control input signal 1137. For example, a digital VCO varactor control input signal may be converted from a digital signal to an analog signal. In some embodiments, the digital sigma-delta DAC 1134 comprises a digital sigma-delta modulator (e.g., digital sigma-delta modulator 1130) followed by a low-pass RC filter (e.g., a resistor-capacitor (RC) low-pass filter 1140), as discussed in further detail below with relation to FIG. 12. In some embodiments, the RC low pass filter 1140 filters out high frequency noise from the digital control input signal 1135 to provide an analog control input signal 1137. The VCO 1160 may receive the analog control input signal 1137 after being filtered and the second digital control signal 1131. As such, the VCO 1160 may be controlled by the analog control input signal 1137 and the second digital control input signal 1130. Further details with regard to the VCO 1160 are discussed in further detail below with relation to FIG. 13.

Figure 12:
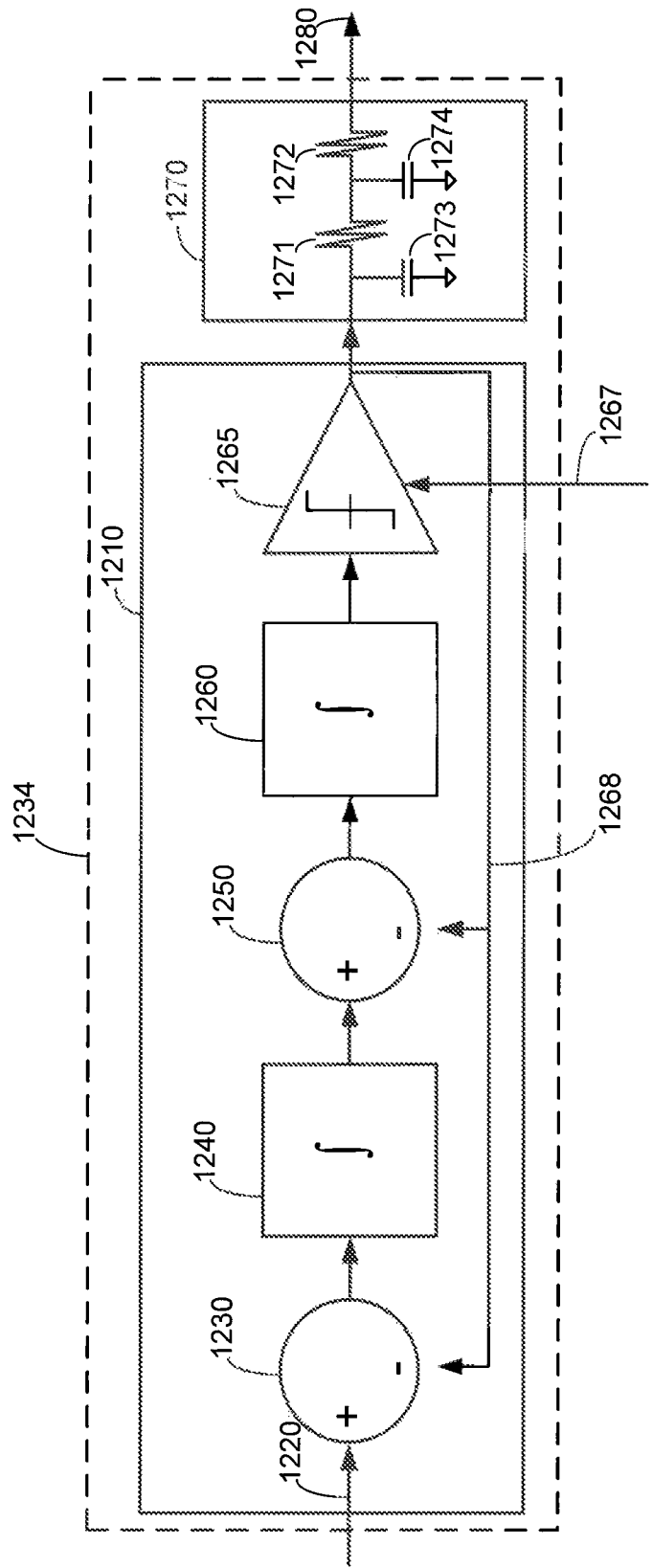
FIG. 12 illustrates a block diagram of a sigma-delta based digital to analog converter with a low pass filter.

FIG. 12 illustrates a block diagram of a digital sigma-delta DAC 1234 consisting of a digital sigma-delta modulator 1210 with an RC low pass filter 1270. In general, the digital sigma-delta DAC 1234 (e.g., digital sigma-delta DAC 134 and/or 1134) may receive a digital control input signal and generate an analog signal to at least partly control a VCO.

In some embodiments, the digital sigma-delta modulator 1210 may be fully implemented in the digital domain. A DAC 1234 may comprise the digital sigma-delta modulator 1210 (e.g., a second order sigma-delta modulator) and may receive a digital control input signal 1220. In some embodiments, a digital loop filter generates the digital multi-bit control input signal 1220 (e.g., signal 1080). For example, a digital loop filter may generate the digital control input signal 1220 by summing a proportional voltage signal and the 11 LSB of an integral voltage signal. The digital sigma-delta modulator 1210 may comprise a second order sigma-delta modulator that comprises subtractors 1230 and 1250, integrators 1240 and 1260, quantizer 1265, and a feedback path 1268. The subtractor 1230 may receive the digital control input signal 1220 and output signal 1266 from a feedback path 1268. In some embodiments, the subtractor 1230 subtracts a signal from the feedback path 1268 from the digital control input signal 1220. An integrator 1240 may receive the output of the subtractor 1230 and integrate the subtractor 1230 output to generate an integrated signal. A subtractor 1250 may receive the integrated signal from the integrator 1240 and the signal (e.g. output signal 1268) from the feedback path 1268. In some embodiments, the subtractor 1250 subtracts the signal from the feedback path 1268 from the output of the integrator 1240. An integrator 1260 may receive the output of the subtractor 1250 and integrate the output of the subtractor 1250. A quantizer 1265 may receive the output of the integrator 1260 and an oversampling clock signal 1267 and convert the output of the subtractor 1260 to a bitstream of ones and zeros toggling at the frequency of the oversampling clock signal 1267. The quantized output 1266 may be received by an RC low pass filter 1270 (e.g., RC low pass filter 138 and/or 1140) where the RC low pass filter 1270 may filter out high frequency noise from the quantized output 1266. As such, the DAC 1234 (e.g., comprising a digital delta-sigma modulator and an RC low pass filter) may generate the analog voltage for the output analog signal 1280. In some embodiments, the RC low pass filter 1270 comprises resistors 1271 and 1272 and capacitors 1273 and 1274.

As such, a sigma-delta based DAC and an RC low pass filter may be used to convert a digital control signal from a digital loop filter to an analog voltage for at least partly controlling a VCO (e.g., at least one varactor of a VCO).

Figure 13:
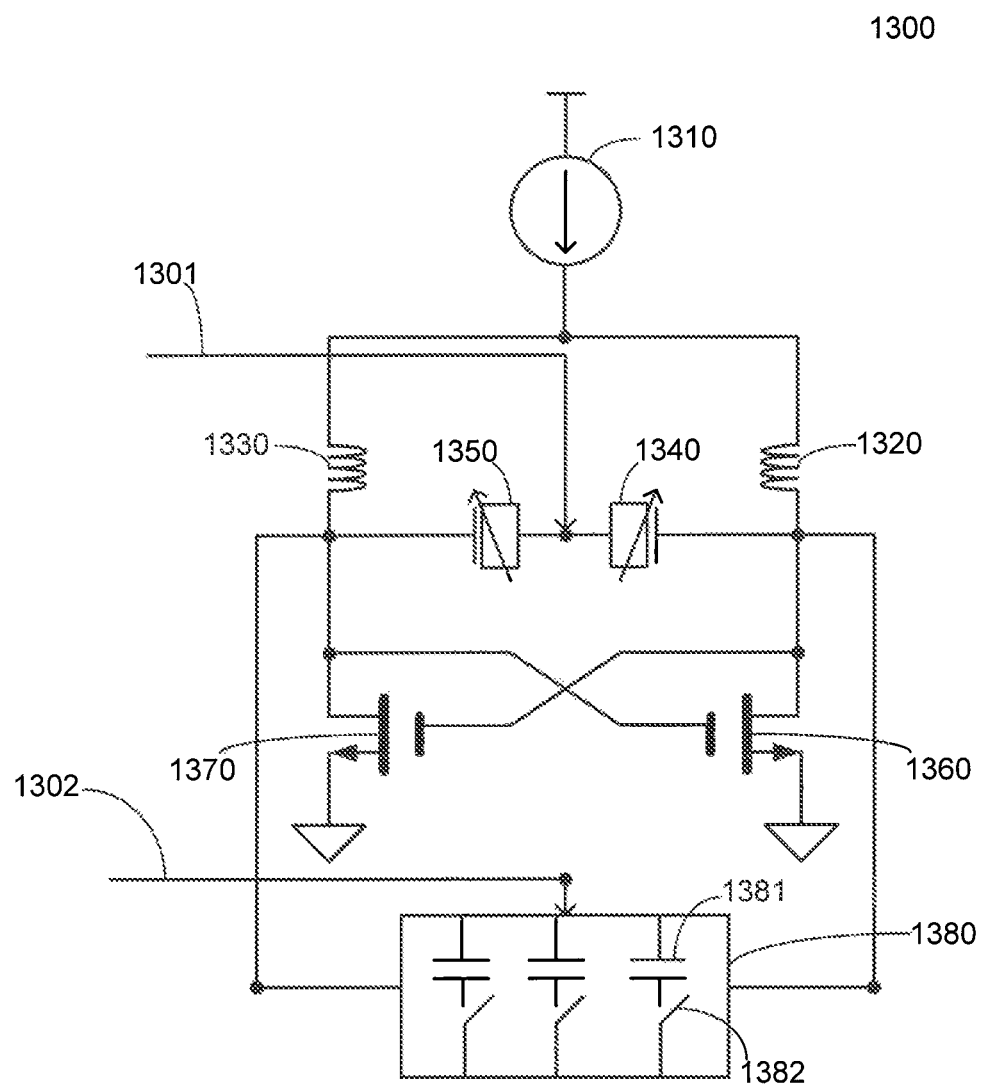
FIG. 13 illustrates a voltage-controlled oscillator in accordance with some embodiments.

FIG. 13 illustrates a voltage-controlled oscillator (VCO) 1300 in accordance with some embodiments. In general, the VCO 1300 (e.g., VCO 140 and/or 1160) comprises tuning capacitors and an array of varactors that may be controlled by one or more control signals.

As seen in FIG. 13, the VCO 1300 may comprise a current source 1310, varactors 1340 and 1350, resistors 1320 and 1330, transistors 1360 and 1370, and tuning capacitors 1380. The VCO 1300 may receive a plurality of control signals. For example, the VCO 1300 may receive a voltage control signal 1301 (e.g., output analog signal 1280 and/or digital control input signal 1135) to control an array of varactors (e.g., varactors 1340 and 1350) and a tuning capacitor selection control signal 1302 (e.g., VCO tuning capacitor control signal 1072 and/or second digital control signal 1131) to control one or more of the tuning capacitors 1380. In some embodiments, the voltage control signal 1301 may be an analog signal and the tuning capacitor selection control signal 1302 may be a digital signal. In some embodiments, the varactors 1340 and 1350 each have a variable capacitance. For example, each of the varactors 1340 and 1350 may comprise a diode that has a variable capacitance that is a function of the voltage impressed on its terminals. As such, the voltage control signal 1301 may be applied to the terminals of varactors 1340 and 1350 to define a capacitance for each of the varactors 1340 and 1350. In the same or alternative embodiments, the tuning capacitors 1380 may comprise one or more capacitors 1381 and one or more switches 1382. Each of the one or more capacitors 1381 may be selected by a sub signal (or a bit) of the tuning capacitor selection control signal 1302. For example, each bit of the capacitor selection control signal 1302 may be used to control a corresponding switch 1382 that may be used to select or not select (e.g., disconnect) a capacitor 1381. The changing of the capacitance of the varactors 1340 and 1350 and/or the selection of tuning capacitors 1380 may tune the output frequency of the VCO 1300. As such, the varactors 1340 and 1350 and the tuning capacitors 1380 may be controlled by a voltage control signal 1301 and a tuning capacitor selection control signal 1302 to change or tune the output frequency of the VCO 1300.

Figure 14:
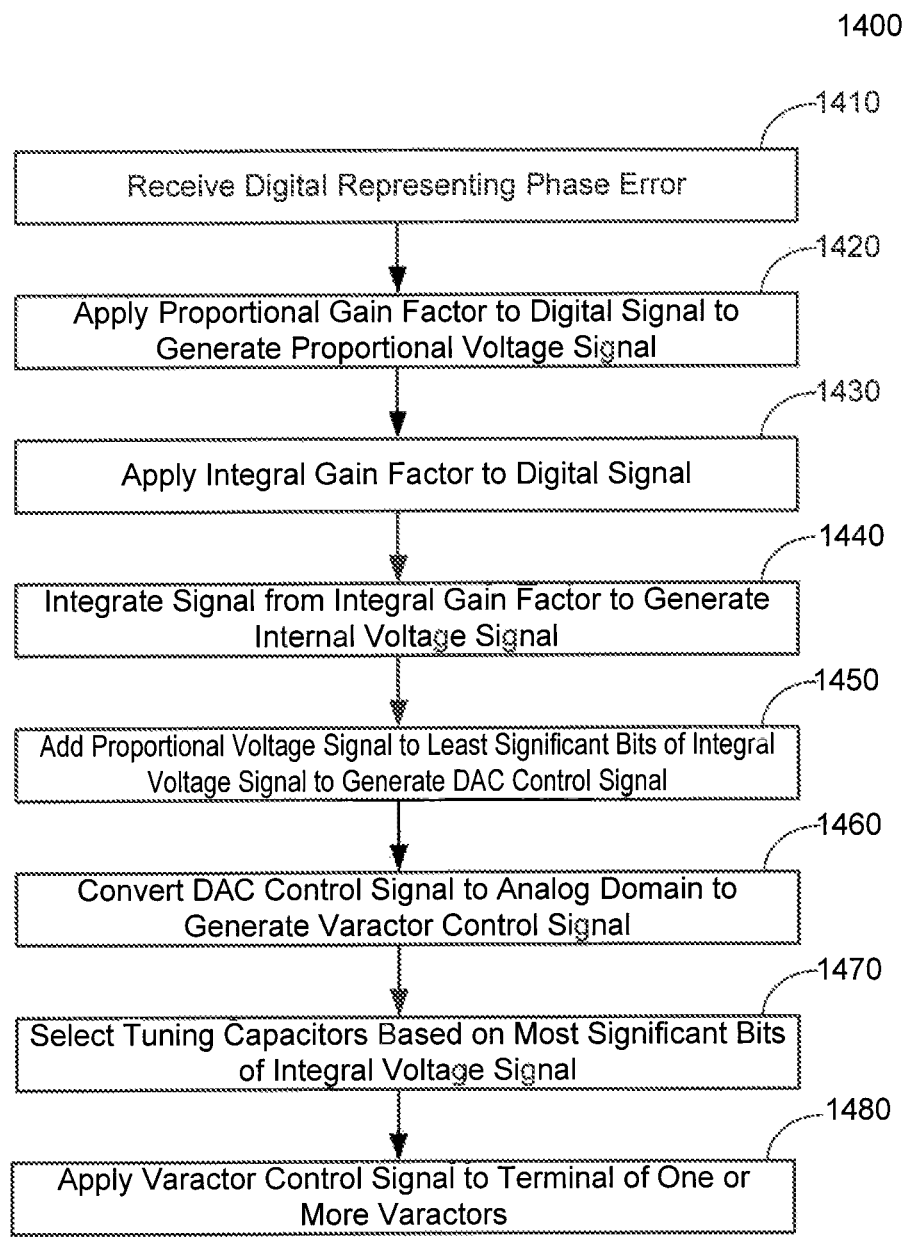
FIG. 14 is a flow diagram of an example method for applying control signals to control varactors and tuning capacitors of a voltage-controlled oscillator.

FIG. 14 is a flow diagram of an example method 1400 for applying control signals to control varactors (e.g., varactors 1340 and 1350) and tuning capacitors (e.g., tuning capacitors 1380) of a VCO (e.g., VCO 140, 1160, and/or 1300). At block 1410, a digital signal may be received. In some embodiments, the digital signal represents a phase error. For example, the digital signal may digitally represent a phase error between a first signal (e.g., a reference clock signal) and a second signal (e.g., a feedback clock signal). In some embodiments, a digital loop filter (e.g., digital loop filter 120) may receive the digital signal. At block 1420, a proportional gain factor (e.g., gain factor 1020) may be applied to the digital signal to generate a proportional voltage signal. As seen, at block 1430, an integral gain factor (e.g., gain factor 1050) may also be applied to the digital signal in parallel with the proportional gain factor. At block 1440, the digital signal with the application of the integral gain factor may be integrated to generate an integral voltage signal. In some embodiments, an integrator (e.g., integrator 1060) may perform the integration operation of the digital signal with the integral gain factor. At block 1450, the least significant bits (LSB) (e.g., the 11 LSB) of the integral voltage signal may be added to the proportional voltage signal to generate a DAC control signal. In some embodiments, a summer (e.g., summer 1040) may add the 11 LSB of the integral voltage signal to the proportional voltage signal to generate the DAC control signal. At block 1460, the DAC control signal may be converted to the analog domain (e.g., an analog signal). For example, a sigma-delta based DAC (e.g., the digital sigma-delta DAC 134, 1134, and/or 1234) may convert the DAC control signal to an analog signal. In some embodiments, the analog signal may comprise a varactor control signal. As seen in FIG. 14, at block 1470, tuning capacitors (e.g., tuning capacitors 1380) in the VCO may be selected based on a number of the most significant bits (MSB) of the integral voltage signal. For example, the seven MSB of the integral voltage signal may be used to control switches (e.g., switch 1382) to select or disconnect one or more tuning capacitors (e.g., capacitor 1381). As such, in some embodiments, each MSB bit of the integral voltage signal may be used to control at least one switch corresponding to at least one tuning capacitor. At block 1480, the varactor control signal may be applied to a terminal of one or more varactors in the VCO (e.g., varactors 1340 and 1350).

FIG. 14 illustrates a plurality of steps. However, one skilled in the art will recognize that the method disclosed herein can be applied to include all or any number of the blocks as shown in method 1400 and in varying sequence.

Figure 15:
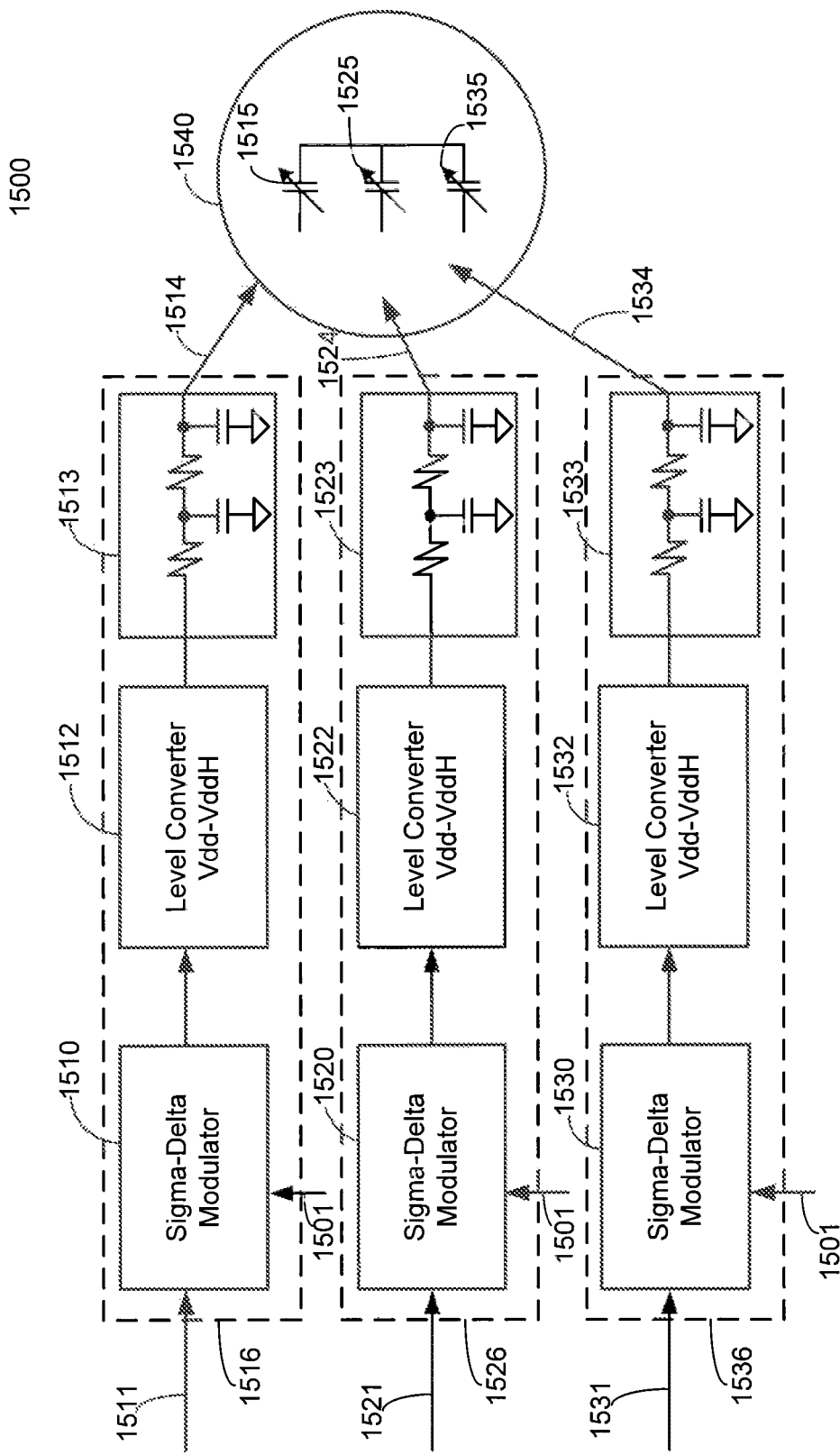
FIG. 15 is a block diagram of a plurality of control signals being used to control an array of varactors in a voltage-controlled oscillator in accordance with some embodiments.

FIG. 15 is a block diagram of a plurality of control signals being used to control an array of varactors in a VCO. In general, a plurality of sigma-delta modulators (e.g., of the type of digital sigma-delta modulator 130, 1130, and/or 1210) may each generate a control bitstream that is passed through the level converter and the RC filter to control a separate varactor (e.g., varactor 1350 and/or 1360) of a VCO (e.g., VCO 140, 1160, and/or 1300).

As seen in FIG. 15, a VCO 1540 may receive a plurality of control signals 1514, 1524, and 1534 for controlling varactors 1515, 1525, and 1535. In some embodiments, each of the digital sigma-delta DACs 1516, 1526, and/or 1536 may comprise a digital sigma-delta modulator that may be used to generate a digital bit-stream that is converted to an analog control signal after passing through a corresponding level converter and associated low pass RC filter to provide the control signals 1514, 1524, and 1534, respectively. For example, the digital sigma-delta DAC 1516 may comprise a digital sigma-delta modulator 1510 that receives a first digital control input signal 1511 and an oversampling clock signal 1501. In some embodiments, the digital sigma-delta modulator 1510 converts the first digital control input signal 1511 to a first bitstream toggling between zero and vdd. A level converter 1512 may convert this toggling to zero and vddH in order to increase the tuning range of the VCO 1540 and a low pass RC filter 1513 may filter out high frequency noise from the first analog control signal 1514. In some embodiments, the first analog control signal 1514 is used to control the varactor 1515. Similarly, the digital sigma-delta DAC 1526 may comprise a digital sigma-delta modulator 1520 that receives a second digital control input signal 1521 (e.g., the first digital control input signal 1511 with a first added offset) and the oversampling clock signal 1501. In some embodiments, the digital sigma-delta modulator 1520 converts the second digital control input signal 1521 to a second bitstream toggling between zero and vdd. A level converter 1522 may convert this toggling to zero and vddH in order to increase the tuning range of the VCO and a low pass RC filter 1523 may filter out high frequency noise from the second analog control signal 1524. In some embodiments, the second analog control signal 1524 is used to control the varactor 1525. Moreover, the digital sigma-delta DAC 1536 may comprise a digital sigma-delta modulator 1530 that may receive a third digital control input signal 1531 (e.g., the first digital control input signal 1511 with a second added offset) and the oversampling clock signal 1501. In some embodiments, the digital sigma-delta modulator 1530 converts the third digital control input signal 1531 to a third bitstream toggling between zero and vdd. A level converter 1532 may convert this toggling to zero and vddH in order to increase the tuning range of the VCO and a low pass RC filter 1533 may filter out high frequency noise from the third analog control signal 1534. In some embodiments, the third analog control signal 1534 is used to control the varactor 1535.

The second digital control signal 1521 and the third digital control signal 1531 may comprise the first digital control input signal 1511 with an offset value. For example, the second digital control signal 1521 may comprise the value of the first digital control input signal 1511 with an offset (e.g., a negative offset value) while the third digital control signal 1531 may comprise the value of the first digital control input signal 1511 with another offset (e.g., a positive offset value).

Digital Fractional-N, Frequency Synthesizer

Figure 16:
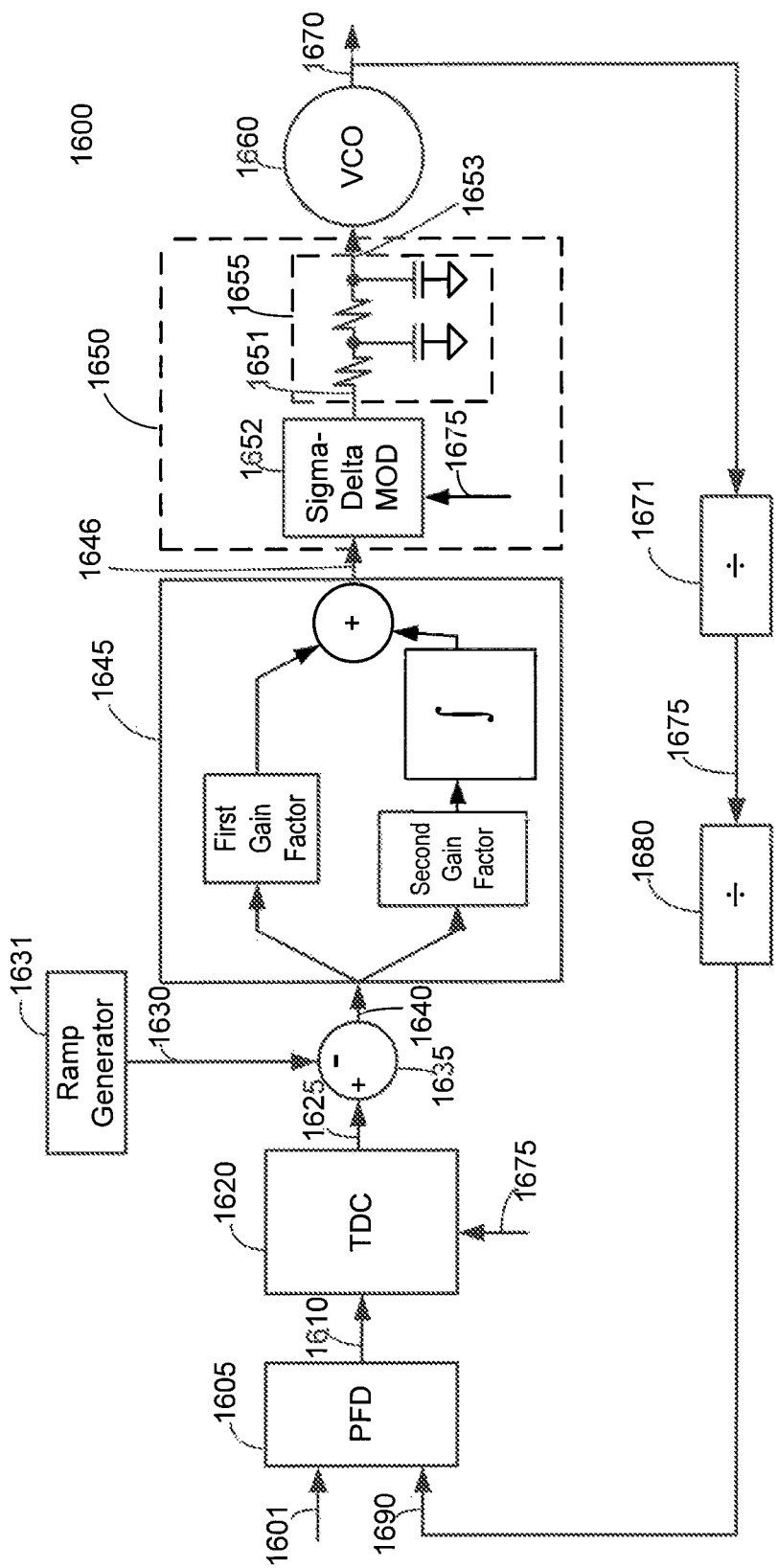
FIG. 16 illustrates a block diagram of a frequency synthesizer in accordance with some embodiments.

FIG. 16 illustrates a block diagram of a frequency synthesizer 1600. In general, the frequency synthesizer 1600 may add or apply a ramp offset signal to the output of a TDC to generate a desired frequency at a fractional factor of an input frequency. In some embodiments, the output of the TDC may follow the ramp offset signal (e.g., dithers around the ramp offset signal).

As seen in FIG. 16, the frequency synthesizer 1600 may comprise a PFD 1605. In some embodiments, the PFD 1605 receives a reference clock signal 1601 and a feedback clock signal 1690. The PFD 1605 may output a phase error signal 1610 that represents the phase error between the reference clock signal 1601 and the feedback clock signal 1690. A TDC 1620 may receive an oversampling clock signal 1675 and the phase error signal 1610 and output a digital TDC output signal 1625 that represents the phase error between the reference clock signal 1601 and the feedback clock signal 1690. In some embodiments, the TDC 1620 may comprise a sigma-delta based TDC (e.g., TDC 110). However, in some embodiments, the TDC 1620 may comprise a TDC that does not comprise a sigma-delta modulator. As such, any type of TDC may be used in the frequency synthesizer 1600.

A summer (e.g., a subtractor) 1635 may receive the TDC output signal 1625 and combine it with a ramp offset 1630 to generate a digital filter input signal 1640. For example, the summer 1635 may subtract the ramp offset 1630 from the TDC output signal 1625 to generate the digital filter input signal 1640. In alternative embodiments, the summer 1635 adds the ramp offset 1630 to the TDC output signal 1625 to generate the digital filter input signal 1640, in which case the TDC output signal 1625 may be negative. A ramp generator 1631 may generate the ramp offset 1630. In some embodiments, a digital filter 1645 receives the digital filter input signal 1640 and generates a digital filter output signal 1646. As seen in FIG. 16, the digital filter 1645 may comprise a proportional path and an integral path. A first gain factor may be applied to the digital filter input signal 1640 in a proportional path and a second gain factor and an integrator may be applied to the digital filter input signal 1640 in an integral path in parallel with the proportional path. A signal in each of the proportional path and the integral path may be added to generate the digital filter output signal 1646.

As seen in FIG. 16, a digital sigma-delta DAC 1650 (e.g., digital sigma-delta DAC 134, 1134, 1234, 1516, 1526, and/or 1536 as an example) may receive an oversampling clock signal 1675 and the digital filter output signal 1646 and convert the digital filter output signal 1646 to an analog signal. For example, a digital sigma-delta modulator 1652 may convert the digital filter output signal 1646 to a digital bitstream signal 1651. In some embodiments, an RC filter 1655 (e.g., RC filter 138, 1140, and/or 1270) may filter the digital bitsream 1651 to generate an analog control signal 1653. A VCO 1660 (e.g., VCO 140, 1160, and/or 1300) may receive the analog control input signal 1653 and generate an output clock 1670. The output clock 1670 may be coupled to a feedback path comprising a divider 1671 to generate an oversampling clock signal 1675 and a divider 1680 that generates the feedback clock signal 1690.

Figure 17:
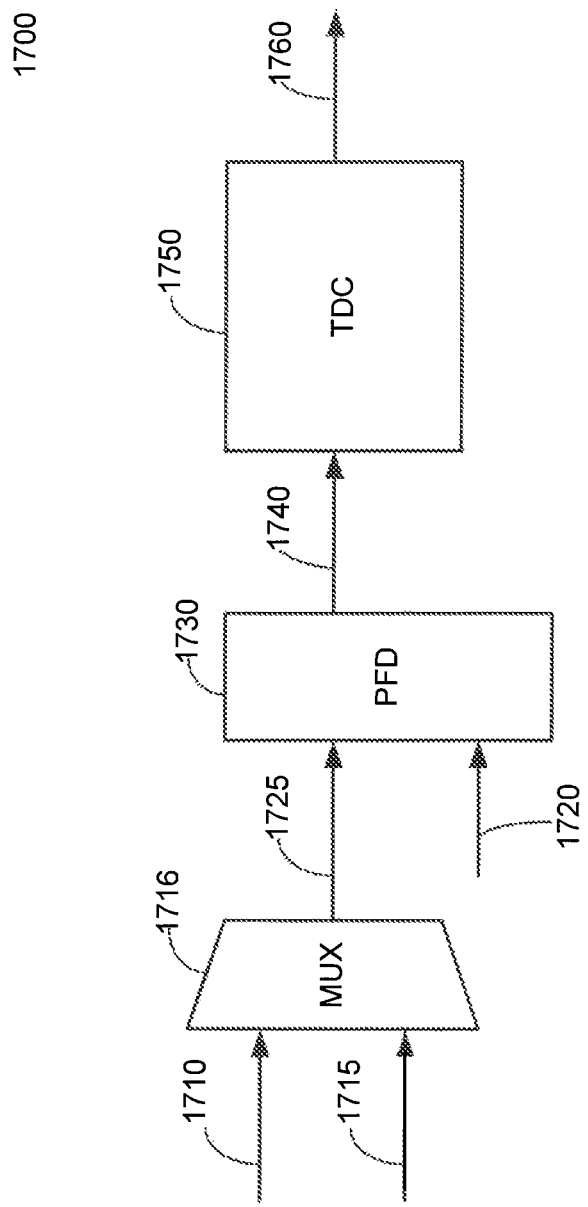
FIG. 17 is a block diagram of an architecture for switching between a first reference clock signal and an inverse of the first reference clock signal.

FIG. 17 is a block diagram of an architecture 1700 for switching between a first reference clock signal and a second reference clock signal (e.g., the inverse/complement of the first reference clock signal). In general, switching from a first reference clock signal to a second reference clock signal may occur in order to use a TDC (e.g., TDC 110 and/or 1620) transfer function only between a phase offset of 0 to π (pi).

In some embodiments, a TDC output may exhibit an amount of nonlinearity as a phase offset reaches 2π (e.g., in radians). As such, in order to minimize the impact of the nonlinearity of the TDC output in the frequency synthesizer loop, the ramp offset (e.g., ramp offset 1630) may be applied up to a phase offset of π, at which point a switch between a first reference clock signal and a second reference clock signal (e.g., an inverse of the first reference clock signal and/or a signal that goes from 0 to π when the first reference clock signal goes from π to 2π) may occur and the ramp offset is restarted at zero. In some embodiments, this process is repeated as the phase offset of either the first reference clock signal or the second reference clock signal reaches π. As such, in some embodiments, the architecture 1700 may apply the ramp offset to the output of the TDC until a phase offset of the first reference clock signal of π is reached and then restart the ramp offset at zero and switch to the second reference clock signal until the phase offset of the second reference clock signal reaches π, when the ramp offset will restart at zero again and the architecture 1700 switches back to the first reference clock signal. The switching from the first reference clock signal to the second reference clock signal and from the second reference clock signal to the first reference clock signal may occur at each point where the phase offset reaches π.

As seen in FIG. 17, the architecture 1700 may comprise a multiplexer 1716 for receiving a first reference clock signal 1710 and a second (e.g., inverted/complementary) reference clock signal 1715. The multiplexer 1716 may select and output one of the first reference clock signal 1710 and the second reference clock signal 1715. In some embodiments, the multiplexer 1716 outputs either the first reference clock signal 1710 or the second reference clock signal 1715 at least partly based on the phase offset (e.g., whether a phase offset has reached π). A PFD 1730 (e.g., PFD 106 and/or 1605) may receive a multiplexer output signal 1725 (e.g., either the first reference clock signal or the second reference clock signal) and a feedback clock signal 1720 (e.g., clock signal 102 and/or 1690). In some embodiments, the PFD 1730 generates an analog phase error signal 1740 that represents a phase error or difference between the multiplexer output signal 1725 and the feedback clock signal 1720. A TDC 1750 (e.g., TDC 110 and/or 1620) may receive the phase error signal 1740 and generate a TDC output signal 1760. In some embodiments, the TDC output signal 1760 is a digital signal that represents a phase error between the multiplexer output signal 1725 and the feedback clock signal 1720.

Figure 18:
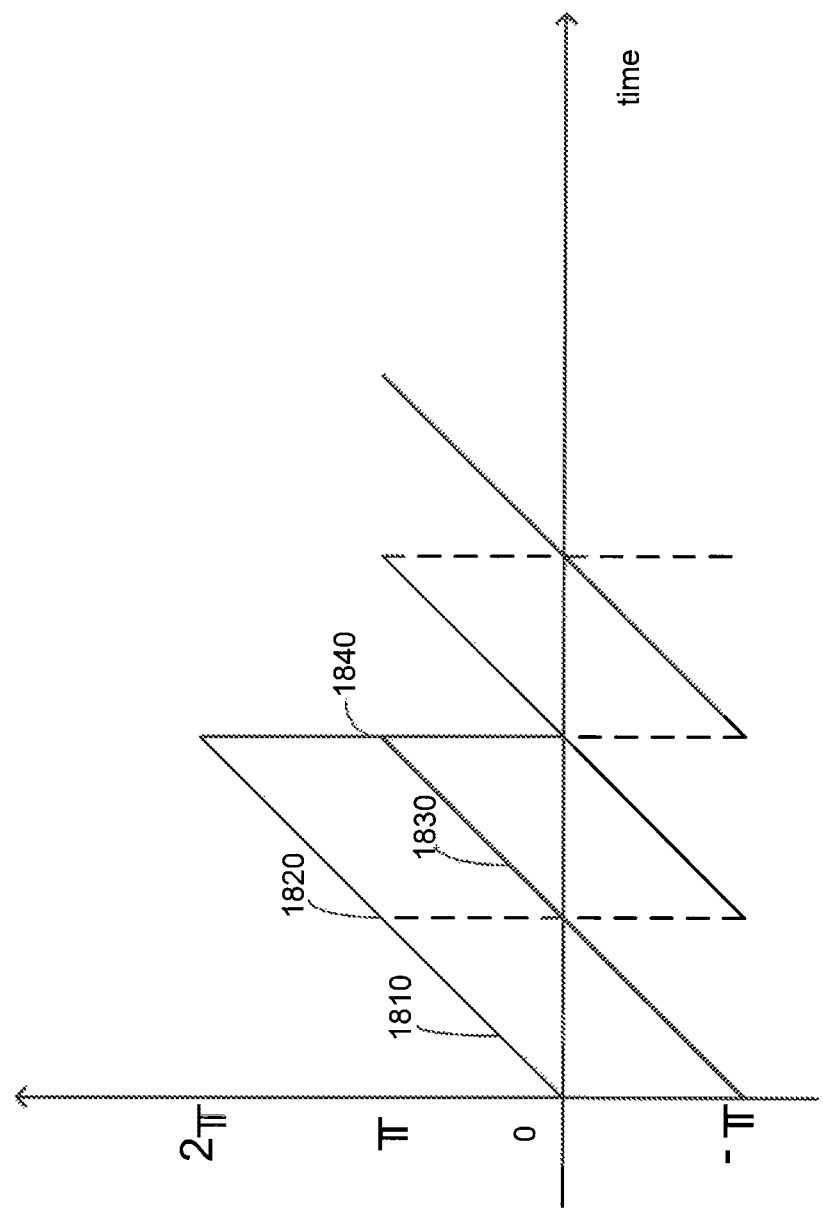
FIG. 18 illustrates a switching between a first reference clock signal and a second reference clock signal in accordance with some embodiments.

FIG. 18 illustrates a switching between a first reference clock signal and a second (e.g., inverted/complementary) reference clock signal in accordance with some embodiments. In general, the ramp offset signal (e.g., ramp offset 1630) may be applied or added to the output of a TDC. The ramp offset signal may be added to the output of the TDC until a first reference clock has a phase offset of π with respect to a feedback clock. At such a point, a switch between the first reference clock and a second reference clock may occur (e.g., a switch from the first reference clock to the second reference clock as received by the PFD 1730) and then the ramp offset signal may be restarted at zero. In some embodiments, the first reference clock signal and the second reference clock signal may have an offset of π with respect to each other.

As seen in FIG. 18, a first reference clock signal 1810 (e.g., first reference clock signal 1710) may be used. At point 1820, the phase offset of the first reference clock signal 1810 has reached π and the ramp offset may restart at zero and a switch from the first reference clock signal 1810 to the second reference clock signal 1830 may occur as received by the PFD. At point 1840, the phase offset of the second reference clock signal 1830 has reached π. As such, at point 1840, the ramp offset is restarted at zero and a switch from the second reference clock signal 1830 to the first reference clock signal 1810 may occur. Thus, the ramp offset may be restarted at zero and added to or applied to the output of a TDC while switching from or to a first reference clock signal 1810 or the second reference clock signal 1830 when the phase offset of the first reference clock signal 1810 or the second reference clock signal 1830 has reached π with respect to a feedback clock signal.

Figure 19:
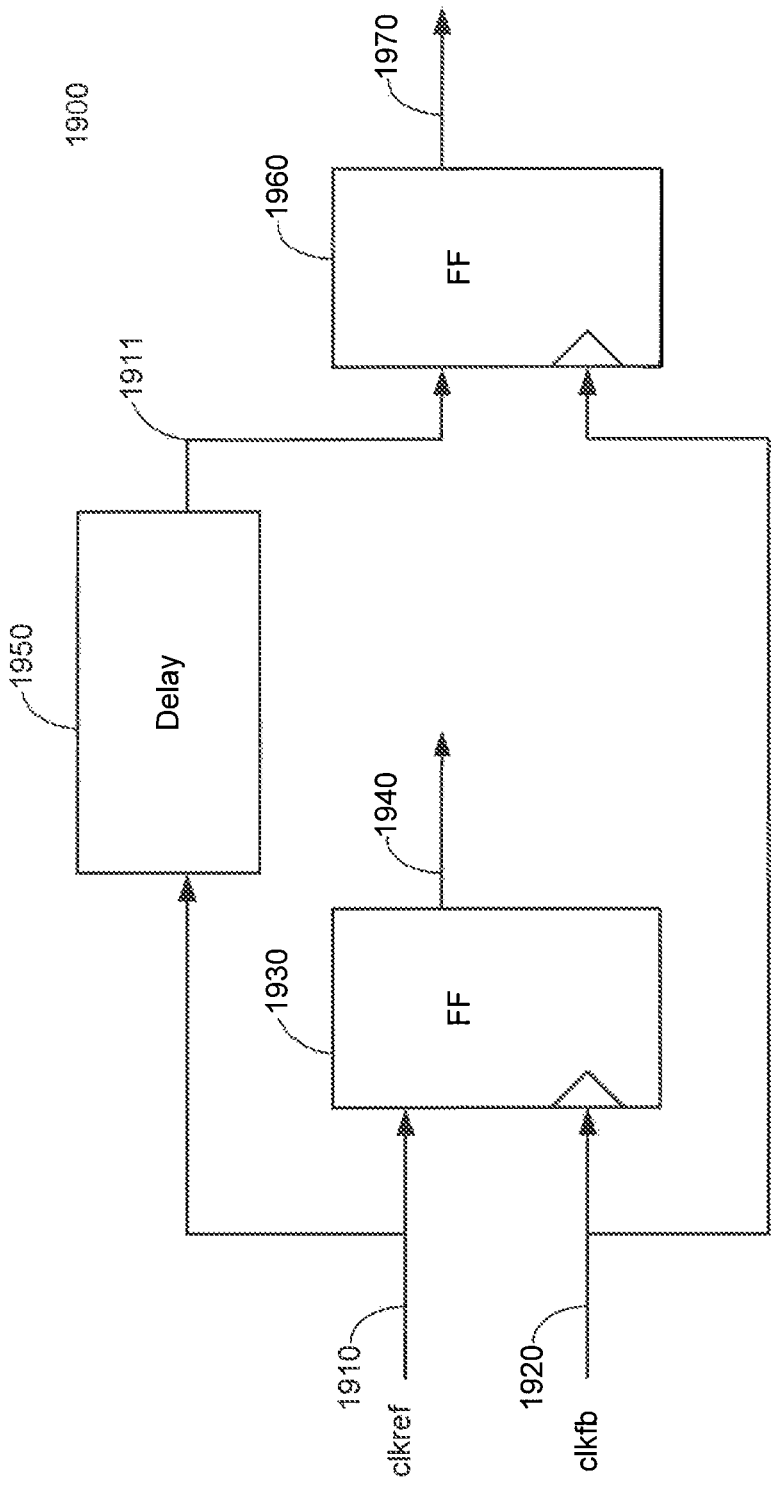
FIG. 19 is a block diagram of an edge detection circuit in accordance with some embodiments of the disclosure.

FIG. 19 is a block diagram of an edge detection circuit used for detecting instances where the edges of a reference clock signal pass the edges of a feedback clock signal for indicating when the reference clock signal has a phase offset of $\pi$ with respect to the feedback clock signal. In some embodiments, a TDC (e.g., TDC 1620 and/or 1750) may comprise the edge detection circuit 1900. As seen in FIG. 19, the edge detection circuit 1900 may comprise a flip-flop 1930, flip-flop 1960, and a delay element 1950 (e.g., two cascaded inverters). A reference clock signal 1910 (e.g., the first reference clock signal 1710 and/or the second reference clock signal 1715) may be coupled to the data input of the flip-flop 1930. The reference clock signal 1910 may further be coupled to the delay element 1950 that adds a delay to the reference clock signal 1910 to generate a delayed reference clock signal 1911. In some embodiments, the delayed reference clock signal 1911 may be coupled to the data input of the flip-flop 1960. Each of the flip-flops 1930 and 1960 may be clocked by the feedback clock signal 1920 (e.g., feedback clock signal 1720).

In operation, the edge detection circuit 1900 may detect when two clock edges pass each other for indicating when a reference clock signal has reached a phase offset of $\pi$ or $2\pi$. For example, the edge detection circuit 1900 may detect when the edges of a reference clock signal and a feedback clock signal pass each other. In some embodiments, the edge detection circuit 1900 may generate a '01' (e.g., flip-flop 1930 generates a '0' and flip-flop 1960 generates a '1') when a rising edge of the reference clock signal passes a rising edge of the feedback clock signal. In some embodiments, this may be equivalent to having a phase offset of 0 or $2\pi$). In the same or an alternative embodiment, the edge detection circuit 1900 may generate a '10' (e.g., flip-flop 1930 generates a '1' and flip-flop 1960 generates a '0') when a falling edge of the reference clock signal passes a rising edge of the feedback clock signal (e.g., equivalent to having a phase offset of $\pi$). In some embodiments, when the edge detection circuit 1900 generates either a '01' or a '10', then the reference clock signal has a phase offset of $\pi$ or $2\pi$ with respect to the feedback clock signal. As such, when the edge detection circuit 1900 generates either a '01' or a '10', a reference clock signal may be switched. For example, a reference clock signal may be switched from a first reference clock signal to a second reference clock signal or from a second reference clock signal to a first reference clock signal when the phase offset of the reference clock signal has reached $\pi$ or $2\pi$ as indicated by the edge detection circuit 1900 outputting either a '01' or a '10.'

In some embodiments, a TDC may be pre-calibrated to detect when a phase offset of $\pi$ occurs. For example, due to gain error in a TDC, a TDC may be pre-calibrated to detect the point at which a phase offset of $\pi$ occurs. As such, the TDC may be run and a first reference clock and/or a second reference clock used to verify when a phase offset of $\pi$ has been reached.

Figure 20:
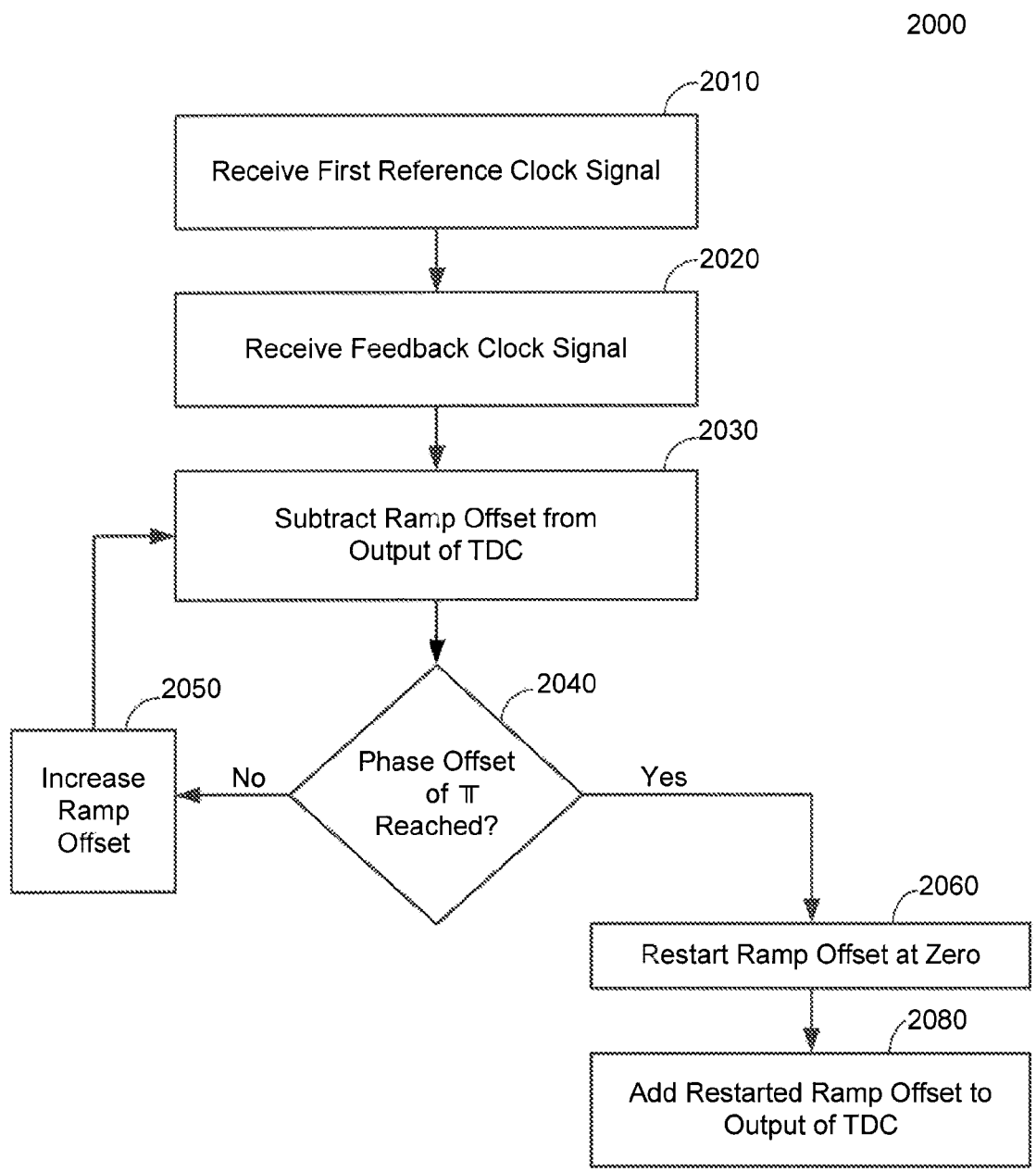
FIG. 20 illustrates a flow diagram of a method for applying a ramp offset to implement a frequency synthesizer.

FIG. 20 is a flow diagram of a method 2000 for applying a ramp offset to implement a frequency synthesizer. In general, the method 2000 applies a ramp offset (e.g., ramp offset signal 1630) to the output of a TDC (e.g., 1620, and/or 1750).

As seen in FIG. 20, at block 2010, a first reference clock signal (e.g., first reference clock signal 1710) may be received. In some embodiments, the first reference clock signal may be received from a multiplexer (e.g., multiplexer 1716). At block 2020, a feedback clock signal (e.g., feedback clock signal 1690 and/or 1720) may be received. In some embodiments, a PFD (e.g., PFD 1605 and/or 1716) may receive the first reference clock signal and the feedback clock signal. The PFD may generate a phase error signal that may be received by a TDC (e.g., TDC 1620 and/or 1750). In some embodiments, the TDC generates a digital signal representing a phase error between the first reference clock signal and the feedback clock signal. At block 2030, a ramp offset (e.g., ramp offset signal 1630) may be applied. For example, the ramp offset may be subtracted from the output of the TDC. In some embodiments, a subtractor (e.g., summer 1635) may subtract the ramp offset from the output of the TDC. At block 2040, a determination is made whether the phase offset of the first reference clock signal has reached a phase offset of $\pi$ relative to the feedback clock signal. In some embodiments, the determination of whether the phase offset of the first reference clock signal has reached a phase offset of $\pi$ may be performed by an edge detection circuit (e.g., edge detection circuit 1900) of a TDC. If the phase offset of the first reference clock signal has not reached $\pi$, then at block 2050, the ramp offset may continue to increase (e.g., linearly with a specific slope) and be added to or applied to the output of the TDC. However, if the phase offset of the first reference clock signal has reached $\pi$, then at block 2060, the ramp offset (e.g., ramp offset signal 1630) may be restarted at a value of zero by switching from the first reference clock signal to a second reference clock signal (e.g., second reference clock signal 1715). For example, a multiplexer (e.g., multiplexer 1716) may receive the first reference clock signal and the second reference clock signal. In some embodiments, the multiplexer selects one of the first reference clock signal and the second reference clock signal to output as a multiplexer output or reference clock signal. As such, the multiplexer may switch between outputting the first reference clock signal and outputting the second reference clock signal. In some embodiments, the multiplexer switches between outputting the first reference clock signal and outputting the second reference clock signal when a phase offset of the signal outputted by the multiplexer (e.g., the first reference clock signal or the second reference clock signal) has reached a phase offset of $\pi$ relative to the feedback clock signal. At block 2080, the restarted ramp offset may be added to or applied to the output of the TDC. In some embodiments, a summer (e.g., summer 1635) may add the restarted ramp offset to the output of the TDC. The ramp offset may start at zero and then linearly increase (e.g., with a specific slope) until the phase offset reaches a value of $\pi$.

As such, a ramp offset signal may be combined with (e.g., subtracted from) an output of a TDC. In some embodiments, a PFD may receive a reference clock signal and a feedback clock signal. A multiplexer may control the reference clock signal that is received by the PFD. For example, the multiplexer may output a first reference clock signal or a second (e.g., inverted/complementary) reference clock signal to be the reference clock signal (e.g., the multiplexer output) to be received by the PFD. If the phase offset between the reference clock signal and the feedback clock signal has reached a value of $\pi$ (pi), then the multiplexer may switch from either the first reference clock signal to a second reference clock signal or vice versa. In some embodiments, a VCO may receive a control signal that is at least partly based from the output of the TDC and/or the ramp offset signal.

Thus, the ramp offset signal may be used to control an output clock frequency of the VCO. For example, the output clock frequency may be a fractional factor of an input clock frequency (e.g., the frequency of reference clock signal 1601, first reference clock signal 1710, and/or second reference clock signal 1715). In some embodiments, the frequency and/or fractional factor of the output clock of the VCO may be at least partly based on a frequency offset (e.g., the ramp offset signal 1630). The frequency offset may be based on the ramp offset signal. For example, changing the slope of the ramp offset signal may change the frequency offset. In some embodiments, the ramp period may be determined by the following equations:

$$T_{ramp} = N_{cycle} \times T_{ref}$$

$$N_{cycle} = \frac{f_{ref} - \Delta f}{\Delta f}$$

In some embodiments, $T_{ramp}$ is the period of the ramp offset signal (e.g., the time it takes for the ramp to go from 0 to 1 or full-scale), $T_{ref}$ is the period of the reference clock, $N_{cycle}$ is the number of the reference clock cycles that it takes for the feedback clock signal and the reference clock signal to sweep the phase offset of 0 to $2\pi$, $f_{ref}$ is the reference clock signal frequency, and $\Delta f$ is the desired frequency offset between the feedback clock signal and the reference clock signal.

Controlling a VCO with an Analog Control Signal and a Digital Control Signal

The systems, circuits, and methods disclosed herein may comprise a digitally controlled oscillator (DCO). In some embodiments, the DCO may comprise a sigma-delta DAC and a hybrid VCO (e.g., a VCO that receives an analog control input signal and a digital control input signal).

In some embodiments, a digital filter may receive an input signal and may generate a first digital control signal and a second digital control signal. A digital to analog converter (DAC) may comprise a sigma-delta modulator. The DAC may receive the first digital control signal and convert the first digital control signal to an analog control signal. A voltage controlled oscillator (VCO) may receive the analog control signal and the second digital control signal. The VCO may generate a clock signal at least partly based on the analog control signal and the second digital control signal.

In the same or alternative embodiments, the sigma-delta modulator comprises at least one integrator and a feedback path.

In some embodiments, the VCO comprises at least one varactor and at least one tuning capacitor. The analog control signal may control the at least one varactor and the second digital control signal may control one or more switches corresponding to the at least one tuning capacitor.

In the same or alternative embodiments, the digital filter comprises a first path in parallel with a second path where each path receives the input signal. The first path comprises a first gain factor to be applied to the input signal to generate a proportional signal. The second path comprises a second gain factor to be applied to the input signal and an integrator to integrate the input signal after applying the second gain factor to generate an integral signal.

In some embodiments, a summer generates the first digital control signal by summing the proportional signal with a number of least significant bits of the integral signal. The second digital control signal comprises a number of most significant bits of the integral signal.

In some embodiments, the sigma-delta modulator further comprises a subtractor to subtract a feedback signal of the feedback path from the first digital control signal. The sigma-delta modulator may further comprise at least one integrator to integrate an output of the subtractor.

In some embodiments, a quantizer may be used to quantize an output of the at least one integrator of the sigma-delta modulator.

As such, the architecture disclosed herein may provide certain advantages that include, but are not limited to, performing PLL loop functions in the digital domain that are more accurate than conventional architectures, require less area, and have easier portability. Moreover, the TDC disclosed herein may provide beneficial advantages such as a high resolution for time-to-digital conversion.

Figure 21:
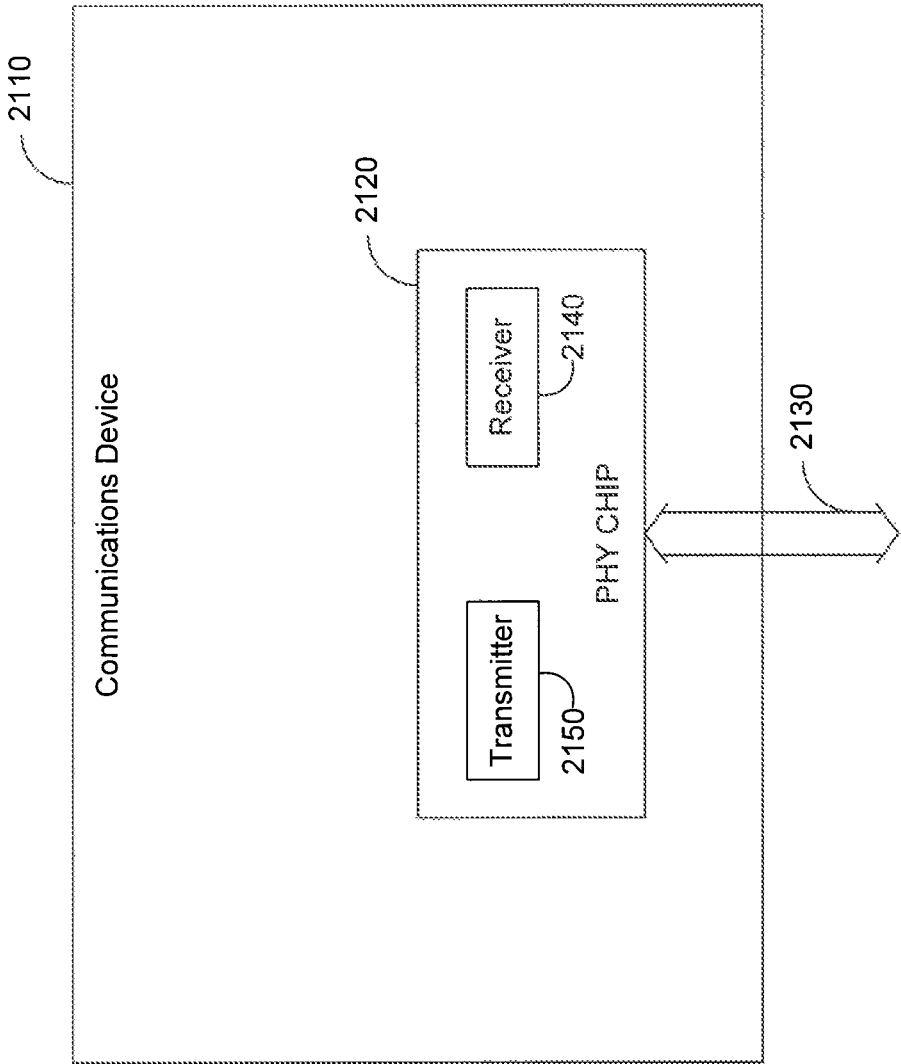
FIG. 21 is a block diagram that illustrates one embodiment for implementing the disclosed systems, circuits, and methods on a single integrated circuit ("IC")

Application Embodiments:

The systems, circuits, and methods disclosed herein may be implemented on one or more integrated circuits. FIG. 21 is a block diagram illustrating one embodiment for implementing disclosed systems, circuits, and methods on a single integrated circuit. In some embodiments, a physical layer ("PHY") integrated circuit 2120 is used to define electrical and physical specifications for a communications device 2110. As such, the PHY integrated circuit 2120 may define the relationship between the communications device 2110 and a transmission medium 2130. The PHY integrated circuit 2120 may include the basic hardware transmission technologies of a network and provide related functions and services. For example, the PHY integrated circuit may, but is not limited to, establish and terminate a connection to a transmission medium 2130, modulate or convert between the representation of digital data used in the communications device 2110 and the corresponding signals transmitted over the transmission medium 2130, providing a standardized interface to the transmission medium 2130, line coding, bit synchronization, circuit switching, multiplexing, forward error correction, and/or bit-interleaving.

In some embodiments, the PHY integrated circuit 2120 includes a transmitter 2150 and a receiver 2140. In general, the transmitter 2150 may modulate and condition data streams for transmission over a transmission medium 2130 and the receiver 2140 may modulate and condition data streams transmitted to the receiver 2140 over a transmission medium 2130. In some embodiments, the transmitter 2150 and/or the receiver 2140 may implement or perform the systems, methods, and circuits discussed with relation to FIGS. 1 through 20. In some embodiments, the PHY integrated circuit 2120 may operate as a transceiver such that the circuit both transmits data over the transmission medium 2130 and receives data from the transmission medium 2130. However, in some embodiments, each of the receiver 2140 and the transmitter 2150 may be implemented as a single integrated circuit. As such, the PHY integrated circuit 2120 may be implemented in the form of a plurality of integrated circuits. Moreover, the transmitter 2150 and/or the receiver 2140 may each comprise IP blocks for incorporation into one or more integrated circuits. Although the PHY integrated circuit 2120 has been discussed with relation to the transmitter 2150 and receiver 2140, it should be appreciated that the PHY integrated circuit 2120 may comprise other hardware components, logical blocks, or integrated circuits that may implement the systems, methods, and circuits disclosed herein. As such, the PHY integrated circuit 2120 may comprise any combination or number of receivers 2140, transmitters 2150, and other hardware components, logical blocks, and/or integrated circuits.

The transmission medium 2130 may transmit and receive data to and from the PHY integrated circuit 2120 in order to facilitate data communication over a network. Examples of a transmission medium may comprise, but are not limited to, metallic (e.g., copper) cables, fiber optic cables, and a wireless network. In some embodiments, if a metallic cable is used as the transmission medium 2130, then the PHY integrated circuit 2120 may convert data transmitted to the transmission medium 2130 into electrical signals. In other embodiments, if a fiber optical cable is used as the transmission medium 2130, then the PHY integrated circuit 2120 may convert data transmitted to the transmission medium 2130 into light signals. Similarly, in some embodiments, if a wireless network is used as the transmission medium 2130, then the PHY integrated circuit 2120 may convert data transmitted to the transmission medium 2130 into electromagnetic signals. As such, in some embodiments, the PHY integrated circuit 2120 receives data for transmission to the transmission medium 2130 and converts the data into signals representing binary 0's and 1's. This converted data may then be received by another component comprised within communications device 2110.

The PHY integrated circuit 2120 may be configured to function with relation to a variety of protocols used by the communications device 2110. For example, the PHY integrated circuit 2120 may be configured to function with regard to an IEEE 802.3 standard such as a 10 Gigabit Ethernet (10 GigE) standard. The PHY integrated circuit 2120 may be configured to function in conjunction with other protocols. Examples of such protocols may comprise, but are not limited to, Synchronous Optical Networking (SONET)/Synchronous Digital Hierarchy (SDH), V.92 for telephone network modems, Infrared Data Association (IrDA) Physical Layer, Universal Serial Bus (USB) Physical Layer, Recommended Standard 232 (RS-232), RS-422, RS-423, RS-449, RS-485, Ethernet Physical Layer (10 Base-T, 10 BASE2, 100 BASE-TX, 10 GigE, etc.), 802.11 Wi-Fi Physical Layers, Digital Subscriber Line (DSL). Integrated Services Digital Network (ISDN), Optical Transport Network (OTN), Bluetooth Physical Layer, and Firewire.

In some embodiments, the PHY integrated circuit 2120 may receive data or a request from another hardware component or software module within the communications device 2110. A software module or hardware component operating at a Data Link Layer may transmit data and/or requests to the PHY integrated circuit 2120. For example, the PHY integrated circuit 2120 may translate logical communication requests from the software module or component operating at a Data Link Layer into hardware specific operations that may affect the transmission or reception of electronic signals over the transmission medium 2130. As such, in some embodiments, the PHY integrated circuit 2120 may communicate and interact with software modules or another component operating at another portion or layer of a communications system. For example, the PHY integrated circuit 2120 may communicate with another software module or another hardware component operating within the Physical Layer, Data Link Layer, Network Layer, Transport Layer, Session Layer, Presentation Layer, and/or Application Layer. As such, the PHY integrated circuit 2120 may be comprised within a communications device 2110 that may also comprise other software modules or hardware components that directly or indirectly communicate with the PHY integrated circuit 2120.

As a result, in some embodiments, the PHY integrated circuit 2120 may receive data from a transmission medium 2130. The PHY integrated circuit 2120 may convert the data and the resulting converted data may be used by other software modules or hardware components within the communications device 2110 or in a separate communications device.

The communications device 2110 may comprise a hardware component configured to operate within a network environment. Examples of a communications device 2110 that may comprise the PHY integrated circuit 2120 are, but are not limited to, a network adapter, network interface controller (NIC), repeater, network hub, switch, router, modem, USB controller, Serial ATA controller, memory (e.g., SDRAM or flash memory) chip interface, transceiver, or a host bus adapter (HBA). The communications device 2110 may comprise, but is not limited to, components of an optical fiber network, such as those components mentioned earlier or a fiber media converter, an add-drop multiplexer (ADM), reconfigurable optical add-drop multiplexers (ROADMs), a regenerator, or a digital cross connect system (DCS). As such, the communications device 2110 may comprise at least one hardware component configured to operate within a network environment.

FIG. 22 is a block diagram illustrating an example embodiment of a network system 2200 that may incorporate the systems, circuits, and methods disclosed herein. In some embodiments, one or more communication devices 2210, 2220, and 2230 are coupled to a network 2240 by a transmission medium 2250, 2260, or 2270. In some embodiments, the devices 2210, 2220, and 2230 are examples of the device 2110 (FIG. 21). In some embodiments, the communication device 2210 may comprise a router coupled to one or more computer devices (not shown) such that the computers are coupled to the network 2240 by means of the router. The router may incorporate one or more PHY integrated circuits 2120. In turn, the PHY integrated circuits may incorporate a receiver and/or a transmitter. In some embodiments, the PHY integrated circuits comprise, at least in part, the various components discussed with relation to FIGS. 1-7, 10-13, 15-17, and 19. In other embodiments, the PHY integrated circuits perform, at least in part, the methods of FIGS. 8, 9, 14, and 20.

In operation, the router 2220 may use a PHY integrated circuit 2120 to transmit data to communications device 2230. As such, the PHY integrated circuit 2120 may be enabled to transmit data from the communication device 2220 over the transmission medium 2250, through the network 2240, to transmission medium 2260 to communications device 2220. The communications device 2220 may also comprise a PHY integrated circuit 2120 that is configured to receive data over the transmission medium 2260.

Hardware Embodiments:

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary nonvolatile storage medium is coupled to the processor such the processor can read information from, and write information to, the storage medium. In the alternative, the nonvolatile storage medium may be integral to the processor. The processor and the nonvolatile storage medium may reside in an ASIC.

The previous description of the disclosed embodiments is provided to enable any person skilled in the art to make or use these and other embodiments. Various modifications to these embodiments will be readily apparent to those skilled in the art, and the generic principles defined herein may be applied to other embodiments without departing from the spirit or scope of the disclosure. Thus, the present claims are not intended to be limited to the embodiments shown herein but are to be accorded the widest scope consistent with the principles and novel features disclosed herein.

CONCLUSION

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A time to digital converter (TDC), comprising:
a sigma-delta modulator configured to receive an analog signal representing a phase error between a first signal and a second signal and to generate a digital signal based on the phase error,
wherein the sigma-delta modulator is further configured:
to store a voltage from a plurality of pulses from the analog signal, and
to generate a value in the digital signal based on the plurality of pulses.

2. The TDC of claim 1, wherein, the sigma-delta modulator comprises:
an integrator; and
a feedback path coupled to the integrator.

3. The TDC of claim 2, wherein the sigma-delta modulator further comprises:
a subtractor configured to subtract a feedback signal of the feedback path from the analog signal,
wherein the integrator is configured to integrate an output of the subtractor.

4. The TDC of claim 3, wherein the sigma-delta modulator further comprises:
a second subtractor configured to subtract the feedback signal from an output of the first integrator;
second integrator configured to integrate an output of the second subtractor; and
a quantizer configured to receive an output of the second integrator and to generate the digital signal.

5. The TDC of claim 4, wherein the sigma-delta modulator comprises at least one capacitor configured to accumulate a voltage corresponding to a width of the plurality of pulses.

6. The TDC of claim 1, wherein the plurality of pulses from the analog signal represents an amount of the phase error between the first signal and the second signal, and
wherein the TDC is further configured to generate the value in the digital signal based on widths of the plurality of pulses corresponding to the phase error.

7. The TDC of claim 1, further comprising:
a demultiplexer configured to downsample an output of the sigma-delta modulator; and
a finite impulse response (FIR) filter configured to filter an output of the demultiplexer.

8. A method, comprising:
receiving an analog signal representing a phase error between a first signal and a second signal;
converting, by a time to digital converter (TDC) comprising a sigma-delta modulator, the analog signal to a digital signal based on the phase error, the converting comprising integrating a difference between the analog signal and a feedback signal provided by the sigma-delta modulator; and
generating a pulse in the digital signal based on the integrating value.

9. The method of claim 8, wherein converting the analog signal to the digital signal comprises:
subtracting the feedback signal from the analog signal to generate a subtracted signal.

10. The method of claim 8, wherein respective pulses from the analog signal represent an amount of the phase error between the first signal and the second signal, and
wherein the pulse in the digital signal is generated in response to the respective pulses.

11. The method of claim 10, wherein the sigma-delta modulator comprises at least one capacitor, and
wherein the converting comprises:
accumulating a voltage on the at least one capacitor for pulses that are received from the analog signal in a first direction to increase the voltage on the at least one capacitor when the first signal is less than the second signal.

12. The method of claim 11, wherein converting the analog signal to the digital signal comprises:
accumulating the voltage stored on the at least one capacitor in a second direction to decrease the voltage on the at least one capacitor when the first signal is greater than the second signal to generate the pulse on the digital signal.

13. The method of claim 8, wherein converting the analog signal to the digital signal comprises:
- downsampling an output of the sigma-delta modulator; and
- filtering the downsampled output of the sigma-delta modulator to generate the digital signal corresponding to an amount of phase difference at an input of the sigma-delta modulator.

14. A phase-locked loop (PLL), comprising:
- a time to digital converter (TDC) configured to receive an analog phase error signal representing a phase difference between a reference clock signal and a feedback clock signal and to generate a digital signal representing the phase error between the reference clock signal and the feedback clock signal; and
- a voltage controlled oscillator (VCO) configured to receive a first control signal and a second control signal, wherein the first control signal and the second control signal are at least partly based on the digital signal, and to output a clock signal at least partly based on the first control signal and the second control signal.

15. The PLL of claim 14, wherein the TDC comprises an integrator and a feedback path.

16. The PLL of claim 15, wherein the TDC further comprises:
- a subtractor configured to subtract a feedback signal of the feedback path, from the analog signal; and
- wherein the integrator is configured to integrate an output of the subtractor.

17. The PLL of claim 16, wherein the TDC further comprises:
- a second subtractor configured to subtract the feedback signal from an output of the integrator;
- a second integrator configured to integrate an output of the second subtractor; and
- a quantizer configured to receive an output of the second integrator and to generate the digital signal.

18. The PLL of claim 15, wherein the analog signal, comprises a plurality of pulses,
- wherein at least one of the pluarlity of pulses comprises an amount of phase error between the reference clock signal and the feedback clock signal, and
- wherein the TDC is configured to create a pulse in the digital signal in response to the plurality of pulses.

19. The PLL of claim 18, wherein the TDC comprises:
at least one capacitor configured:
- to accumulate a voltage stored, in the at least one capacitor in response to the plurality of pulses when the reference clock signal is greater than the feedback clock signal to increase the voltage; and
- to accumulate the voltage in response to the plurality of pulses when the reference clock signal is less than the feedback clock signal to decrease the voltage.

20. The PLL of claim 15, wherein the TDC comprises:
- a sigma-delta modulator;
- a demultiplexer configured to downsample an output of the sigma-delta modulator; and
- a finite impulse response (FIR) filter configured to filter an output of the demultiplexer.

* * * * *

UNITED STATES PATENT AND TRADEMARK OFFICE
CERTIFICATE OF CORRECTION

| | | |
|---|---|---|
| PATENT NO. | : 8,618,967 B2 | Page 1 of 1 |
| APPLICATION NO. | : 13/435449 | |
| DATED | : December 31, 2013 | |
| INVENTOR(S) | : Nikaeen et al. | |

It is certified that error appears in the above-identified patent and that said Letters Patent is hereby corrected as shown below:

In the Claims:

At column 24, line 15, please replace "second integrator" with --a second integrator--.

At column 25, line 27, please replace "feedback path, from" with --feedback path from--.

At column 26, line 11, please replace "the pluarilty of pulses" with --the plurality of pulses--.

Signed and Sealed this
Twenty-fourth Day of June, 2014

Michelle K. Lee
*Deputy Director of the United States Patent and Trademark Office*